US00RE49151E

(19) United States
(12) Reissued Patent
Lim et al.

(10) Patent Number: US RE49,151 E
(45) Date of Reissued Patent: Jul. 26, 2022

(54) MEMORY SYSTEM AND ELECTRONIC DEVICE

(71) Applicant: Samsung Electronics Co., Ltd., Suwon-si (KR)

(72) Inventors: Sun-Young Lim, Hwaseong-si (KR); Dong-Yang Lee, Yongin-si (KR); Young-Jin Cho, Seoul (KR); Oh-Seong Kwon, Hwaseong-si (KR)

(73) Assignee: SAMSUNG ELECTRONICS CO., LTD., Suwon-si (KR)

(21) Appl. No.: 16/381,104

(22) Filed: Apr. 11, 2019

Related U.S. Patent Documents

Reissue of:
(64) Patent No.: 9,620,180
Issued: Apr. 11, 2017
Appl. No.: 14/722,158
Filed: May 27, 2015

(30) Foreign Application Priority Data

Jun. 11, 2014 (KR) ..... 10-2014-0070561

(51) Int. Cl.
*G11C 7/10* (2006.01)
*G06F 13/16* (2006.01)

(52) U.S. Cl.
CPC ..... *G11C 7/10* (2013.01); *G06F 13/1694* (2013.01); *G11C 7/109* (2013.01); *G11C 7/1063* (2013.01)

(58) Field of Classification Search
CPC ..... G06F 13/1694; G11C 7/10; G11C 7/1063
See application file for complete search history.

(56) References Cited

U.S. PATENT DOCUMENTS 6,418,506 B1 7/2002 Pashley et al.
6,456,517 B2 9/2002 Kim et al.
6,457,081 B1 9/2002 Gulick
7,984,319 B2 7/2011 Tahara
(Continued)

FOREIGN PATENT DOCUMENTS

KR 10-2013-0034522 A 4/2013
KR 10-2014-0010794 1/2014
(Continued)

OTHER PUBLICATIONS

Office Action dated Feb. 25, 2020 from the Korean Intellectual Property Office (KIPO) for Korean Patent Application No. 10-2014-007056.

*Primary Examiner* — Woo H. Choi
(74) *Attorney, Agent, or Firm* — Muir Patent Law, PLLC

(57) ABSTRACT

An electronic device includes a memory controller; a first memory device coupled to the memory controller; a second memory device coupled to the memory controller, the second memory device being a different type of memory from the first memory device; and a conversion circuit between the memory controller and the second memory device. The memory controller is configured to send a first command and first data to the first memory device according to a first timing scheme to access the first memory device, and send a second command and a packet to the conversion circuit according to the first timing scheme to access the second memory device. The conversion circuit is configured to receive the second command and the packet, and access the second memory device based on the second command and the packet.

20 Claims, 19 Drawing Sheets

(56) References Cited

U.S. PATENT DOCUMENTS

| | | | | |
|---|---|---|---|---|
| 8,359,423 | B2 | 1/2013 | Rosner et al. | |
| 8,427,891 | B2 | 4/2013 | Best | |
| 8,432,716 | B2 | 4/2013 | Miura et al. | |
| 8,611,123 | B2 | 12/2013 | Koh | |
| 8,683,149 | B2 | 3/2014 | Ware et al. | |
| 8,880,818 | B2 * | 11/2014 | Ware | G06F 13/1694 711/103 |
| 2008/0010420 | A1 | 1/2008 | Kao | |
| 2010/0146256 | A1 | 6/2010 | Luo et al. | |
| 2013/0080858 | A1 | 3/2013 | Lee et al. | |
| 2013/0346678 | A1 | 12/2013 | Jo et al. | |

FOREIGN PATENT DOCUMENTS

| | | | |
|---|---|---|---|
| KR | 10-2014-0010794 | A | 1/2014 |
| WO | 2009/052527 | A1 | 4/2009 |

* cited by examiner

MEMORY SYSTEM AND ELECTRONIC DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

This application claims priority under 35 USC §119 to Korean Patent Application No. 10-2014-0070561, filed on Jun. 11, 2014 in the Korean Intellectual Property Office (KIPO), the contents of which are herein incorporated by reference in their entirety.

BACKGROUND

1. Technical Field

Example embodiments relate generally to semiconductor memory devices, and more particularly to memory systems including semiconductor memory devices.

2. Description of the Related Art

Semiconductor memory devices can be roughly divided into two categories depending upon whether they retain stored data when disconnected from power. These categories include volatile memory devices, which lose stored data when disconnected from power, and nonvolatile memory devices, which retain stored data when disconnected from power. Data write and/or read operations of the volatile memory devices may be different from data write and/or read operations of the nonvolatile memory devices. Various schemes have been researched to effectively access different types of semiconductor memory devices included in a single memory system.

SUMMARY

Accordingly, the present disclosure is provided to substantially obviate one or more problems due to limitations and disadvantages of the related art.

Some example embodiments provide a memory system that includes different types of semiconductor memory devices and capable of effectively performing data read/write operations.

According to example embodiments, an electronic device includes: a memory controller; a first memory device coupled to the memory controller; a second memory device coupled to the memory controller, the second memory device being a different type of memory from the first memory device; and a conversion circuit between the memory controller and the second memory device. The memory controller is configured to: send a first command and first data to the first memory device according to a first timing scheme to access the first memory device, and send a second command and a packet to the conversion circuit according to the first timing scheme to access the second memory device. The conversion circuit is configured to: receive the second command and the packet, and access the second memory device based on the second command and the packet.

According to other example embodiments, an electronic device is configured to communicate with a memory controller. The electronic device includes: a first memory device configured to be coupled directly to the memory controller; a conversion circuit; and a second memory device configured to be coupled indirectly to the memory controller through the conversion circuit, the second memory device being a different type of memory from the first memory device. The first memory device is configured to communicate directly with the memory controller in response to a first type of access command transmitted from the memory controller, and the second memory device is configured to communicate indirectly with the memory controller through the conversion circuit. The conversion circuit is configured to communicate with the memory controller in response to the first type of access command transmitted from the memory controller.

According to still another embodiment, a memory system includes: a first memory device that uses a first communication protocol for read and write operations; a second memory device that uses a second communication protocol different from the first communication protocol for read and write operations; a conversion circuit in communication with the second memory device; and a memory controller configured to generate a first command and a first address in a first operation mode and to access the first memory device using the first command, the first address, and the first communication protocol in the first operation mode, and configured to generate a second command in a second operation mode, to access the second memory device through the conversion circuit, and to communicate with the conversion circuit using the first command and the second communication protocol. The first command and the second command are both commands used for the first communication protocol, and the conversion circuit receives the second command and communicates with the second memory device using the second communication protocol.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
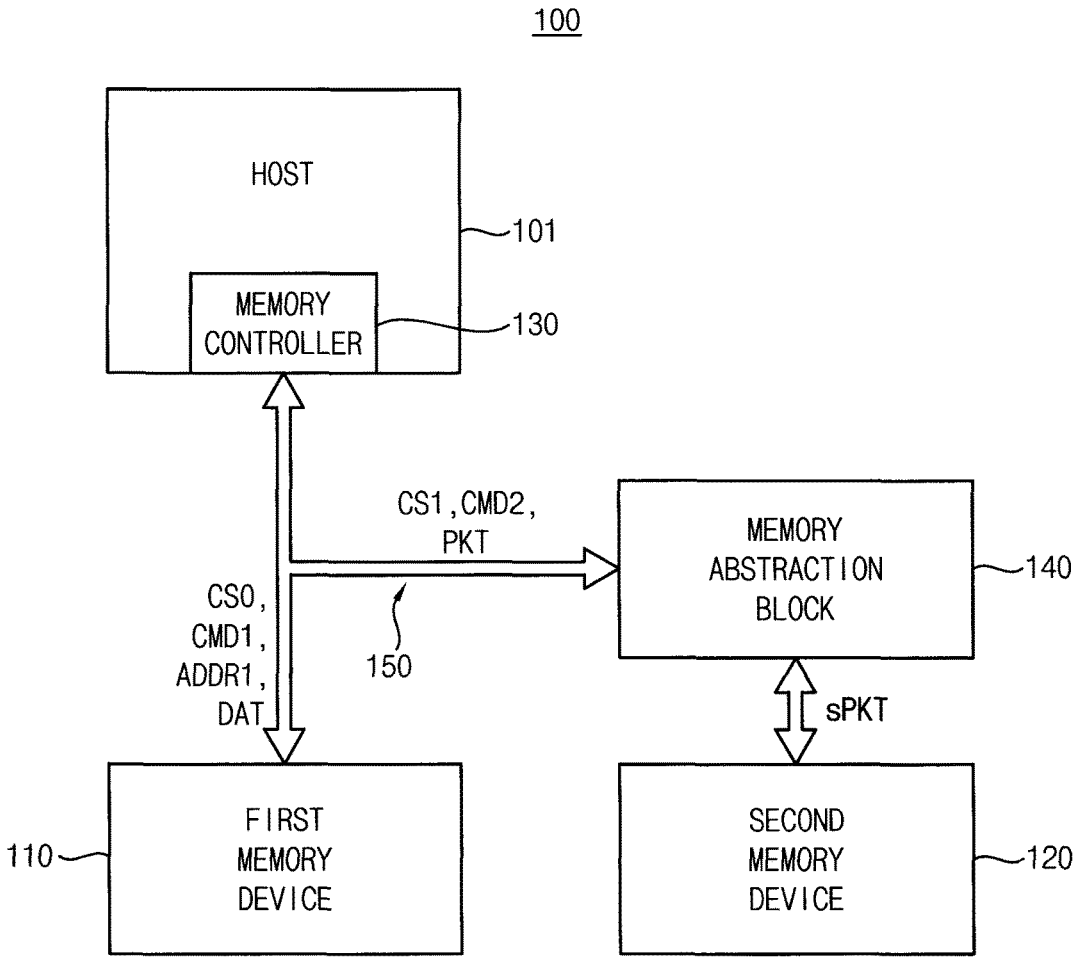
FIG. 1 is a block diagram illustrating a memory system according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

It will be understood that, although the terms first, second, etc. may be used herein to describe various elements, these elements should not be limited by these terms. Unless the context indicates otherwise, these terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as contacting another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a memory system according to example embodiments.

Referring to FIG. 1, a memory system 100 includes a first memory device 110, a second memory device 120, a memory controller 130 and a memory abstraction block 140. The memory system 100 may further include a host 101 and a first channel 150. Different elements of the memory system 100, either alone or in combination, may be referred to herein as an electronic device. For example, an electronic device may refer to the entire memory system 100 or even an apparatus in which the memory system 100 is included. Also, as another example, an electronic device may refer to a portion of the memory system 100 such as the memory abstraction block 140 and the first and second memory devices 110 and 120.

The first memory device 110 operates based on a deterministic interface. In the deterministic interface, data (e.g., write data or read data) are transmitted to or received from the first memory device 110 within a first period after commands (e.g. a write command or a read command) are generated. In certain embodiments, the first memory device 110 may include any volatile memory device, e.g., a dynamic random access memory (DRAM), and the deterministic interface may correspond to a DRAM interface. Described in another way, the first memory device 110 may communicate directly, to have a direct interface with the memory controller 130. In one embodiment, commands, address information, and data may be transmitted from the memory controller 130 to the first memory device 110, and by directly using those commands, addresses, and data, with respect to each other, the first memory device may be accessed. The commands may be a certain type of access command. For example, if the first memory device 110 is a DRAM, than standard DRAM signals including DRAM-type commands may be sent from the memory controller 130 to the first memory device 110.

The second memory device 120 operates based on a nondeterministic interface. In the nondeterministic interface, packets including the data are transmitted to or received from the second memory device 120, and thus the data are not transmitted to or received from the second memory device 120 within the first period after the commands are generated as occurs in the deterministic interface. In certain embodiments, the second memory device 120 may include any nonvolatile memory device, e.g., a flash memory, a phase random access memory (PRAM), a ferroelectric random access memory (FRAM), a resistive random access memory (RRAM), a magnetic random access memory (MRAM), etc. Described in another way, the second memory device 120 may communicate indirectly, through the memory abstraction block 140 (described in greater detail later), to have an indirect interface with the memory controller 130. In one embodiment, commands, address information, and data for the second memory device 120 may be transmitted from the memory controller 130 to the second memory device 120 in a different form and using different processing procedures compared to the first memory device 110. For example, as described in greater detail later, certain information may be sent from the memory controller 130 to a memory abstraction block 140 in packet form. As such, the memory controller 130 is equipped with circuitry that can transmit signals in two different formats—one including commands and additional information, the additional information being in non-packet form, and the other including commands and additional information, the additional information being in packet form.

The memory controller 130 operates based on requests from the host 101. The memory controller 130 generates a first command CMD1 and a first address ADDR1 in a first operation mode and generates a second command CMD2 in a second operation mode. The memory controller 130 exchanges first data DAT with the first memory device 110 through the first channel 150 based on the first command CMD1 and the first address ADDR1 in the first operation mode and exchanges data in a packet form, e.g., a first packet PKT, with the memory abstraction block 140 through the first channel 150 based on the second command CMD2 in the second operation mode. A second address ADDR2 may be included in the second operation mode, but generally is not needed or used.

For example, the memory controller 130 may transmit the first command CMD1 and the first address ADDR1 to the first memory device 110 through the first channel 150 based on an operation timing of the interface circuit in the first operation mode. The memory controller 130 may transmit the second command CMD2 to the memory abstraction block 140 through the first channel 150 based on the same operation timing of the interface circuit in the second operation mode. These operation timings may be referred to as timing schemes, and this first timing scheme may be associated with a first communication protocol for communicating between a memory controller and a memory device (e.g., it may be a volatile memory timing scheme used, for example, with DRAM). The memory controller 130 may exchange the first data DAT with the first memory device 110 through the first channel 150 based on the first timing scheme of the interface circuit in the first operation mode. The memory controller 130 may exchange the first packet PKT with the memory abstraction block 140 through the first channel 150 based on the first timing scheme of the interface circuit in the second operation mode. Detailed operations of the memory controller 130 will be described below with reference to FIGS. 2, 3A, 3B, 5, 6A and 6B.

In some example embodiments, the memory controller 130 may further transmit the second address ADDR2 to the memory abstraction block 140 through the first channel 150 based on the first timing scheme of the interface circuit in the second operation mode.

In some example embodiments, the memory controller 130 may further generate a first signal CS0 and a second signal CS1. The first operation mode may be enabled based on the first signal CS0, and the second operation mode may be enabled based on the second signal CS1. For example, the memory system 100 may operate in the first operation mode when the first signal CS0 is activated and may operate in the second operation mode when the second signal CS1 is activated. For example, the first signal CS0 may be a first chip selection signal, and the second signal CS1 may be a second chip selection signal. Though referred to as chip select signals, these signals may also represent signals for selecting a package, for example in the case where the memory device is a chip stack package device. In the case where two chip selection signals are used, chip selection signals that are included in a conventional deterministic interface (e.g., the DRAM interface) may be used as the first and second signals CS0 and CS1. For another example, the first and second signals CS0 and CS1 may be any selection signals. In this case, additional signals that are not included in the conventional deterministic interface may be used as the first and second signals CS0 and CS1. In either embodiment, the first and second signals CS0 and CS1 may be the same types of signals as each other, recognizable as chip selection signals by both the first memory device 110 and the memory abstraction block 140.

As described above, the first signal CS0, the first command CMD1 and the first address ADDR1 may be used for accessing the first memory device 110. The second signal CS1 and the second command CMD2 may be used for accessing the second memory device 130 through the memory abstraction block 140. The second address ADDR2 may be used as well in certain embodiments. Because the first signal CS0, the first command CMD1, the second signal CS1, and the second command CMD2 all may have the same form and be the same types of signals, the same type of chip select and access command signals output from a memory controller may be used to access different types of memory devices.

The memory abstraction block 140 is connected to the second memory device 120. The memory abstraction block 140 controls a communication between the memory controller 130 and the second memory device 120 in the second operation mode. For example, the memory abstraction block 140 may receive the first packet PKT from the memory controller 130, and may exchange information sPKT with the second memory device 130 using information from the first packet PKT and based on the second command CMD2 and an operation timing dictated by the memory abstraction block 140, which may be referred to as a nondeterministic interface or as a conversion circuit, a conversion interface or a conversion interface circuit. As described in more detail later, the memory abstraction block 140 may include circuitry that abstracts (or extracts, or separates) certain information from the packet PKT received from the memory controller 130. That abstracted information may be used to access the second memory device 120. As such, the memory abstraction block 140 may be referred to as a conversion interface circuit that converts the packet into the signals to be used to access the second memory device 120, which may be accessed according to standard access protocols for that device. Detailed operations of the memory abstraction block 140 will be described further below with reference to FIGS. 2, 3B, 5 and 6B.

The host 101 may perform various computing functions, such as executing specific software for performing specific calculations or tasks. The host 101 may execute an operating system (OS) and/or applications. Although not illustrated in FIG. 1, the host 101 may include a processor, a main memory, a bus, etc. The memory controller 130 may be included in the host 101.

The first channel 150 may be used for providing commands, addresses, data, and packets based on the operation timing of the interface circuit of the memory controller 130.

The memory system 100 according to example embodiments may support both the deterministic interface (e.g., for the first memory device 110) and the nondeterministic interface (e.g., for the second memory device 120) based on one channel (e.g., the first channel 150) and one memory controller (e.g., the memory controller 130). For example, the first data DAT may be exchanged between the memory controller 130 and the first memory device 110 based on the operation timing of the deterministic interface. The first packet PKT may be exchanged between the memory controller 130 and the memory abstraction block 140 based on the operation timing of the deterministic interface and may be exchanged between the memory abstraction block 140 and the second memory device 120 based on the operation timing of the nondeterministic interface. Stated differently, the memory controller 130 may use a certain type of communication protocol to communicate directly with the first memory device 110 and the memory abstraction block 140. One example of this protocol is a DRAM-type communication protocol, which includes a chip select, a command, an address, and data. The chip select and command, for example, may be a first, e.g., DRAM-type chip select signal and command. In one embodiment, when the memory controller 130 communicates in a first mode with the first memory device 110, it uses the chip select and command, as well as an address and data which are directly used to access the first memory device 110 according to DRAM timing, for example. However, when the memory controller 130 communicates in a second mode with the second memory device 120, it may use the chip select and command having the first type, as well as a packet to communicate with the memory abstraction block 140 according to the same timing scheme (e.g., DRAM timing), but the memory abstraction block 140 uses the packet to communicate with the second memory device 120 according to a separate timing scheme, access command-type, and/or communication protocol. Accordingly, the memory system 100 may include various memory devices having various latencies and may have a relatively improved performance.

Figure 2:
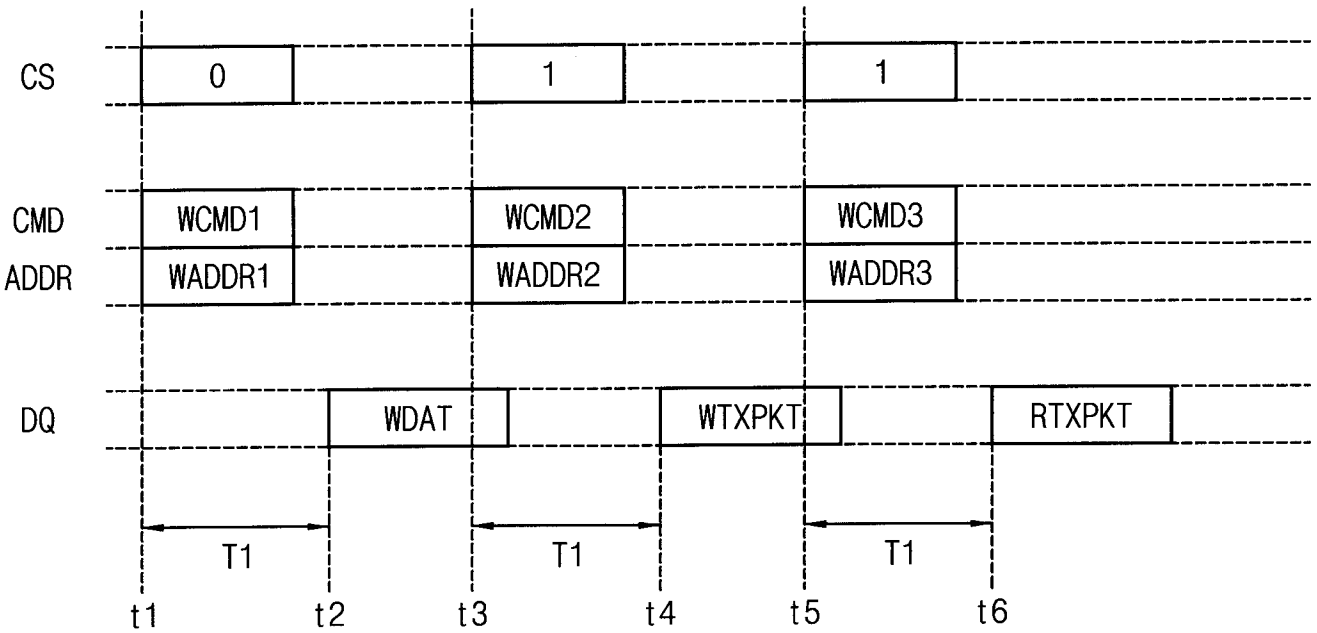
FIGS. 2, 3A, and 3B are diagrams for describing operations of the memory system of FIG. 1.
Figure 3A:
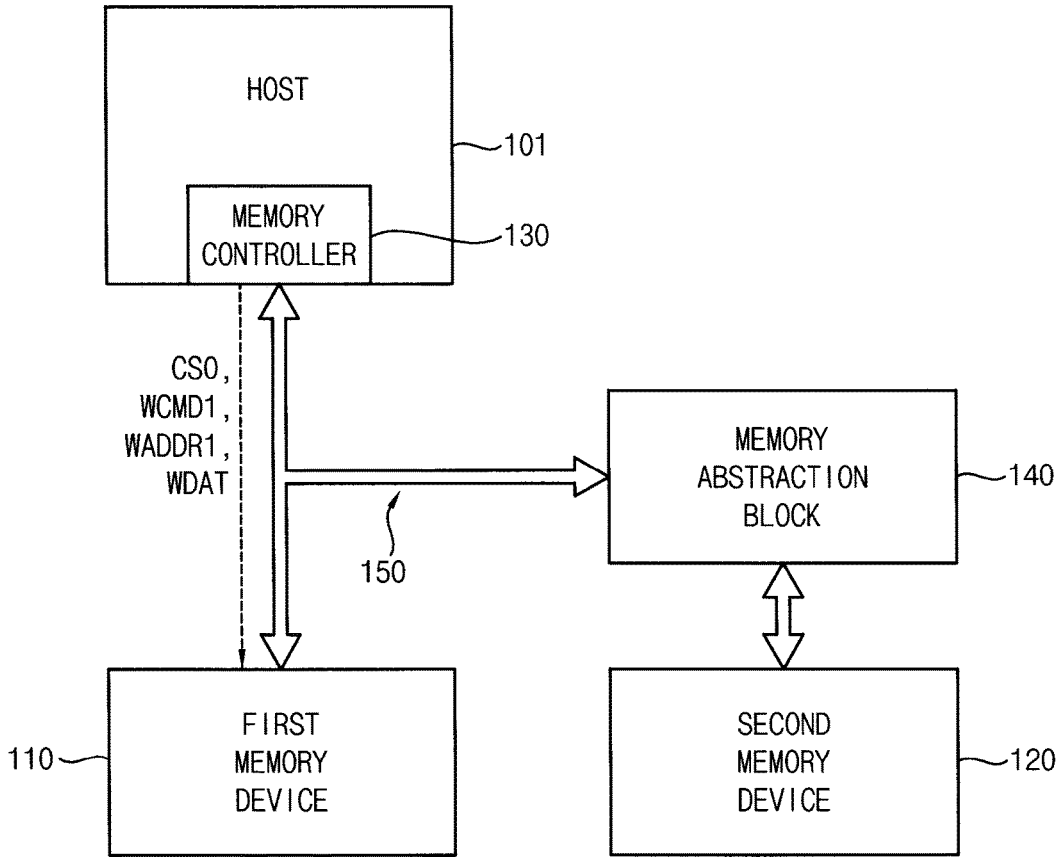
Figure 3B:
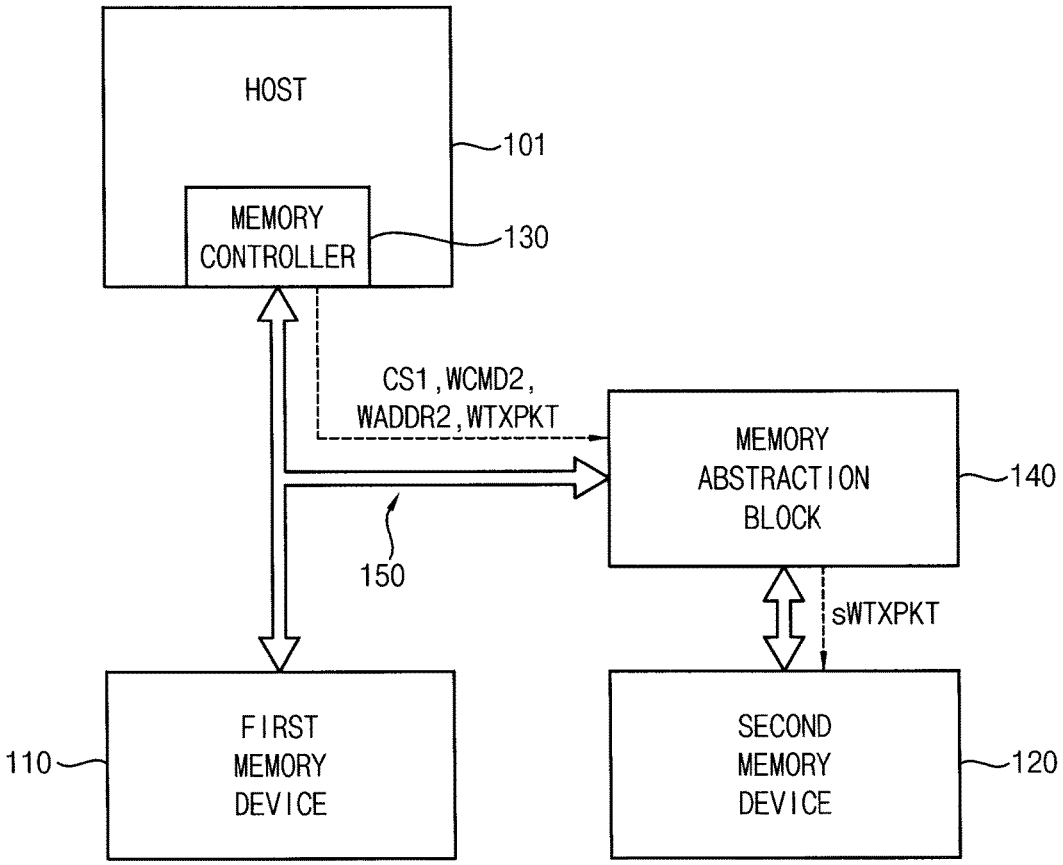

FIGS. 2, 3A and 3B are diagrams for describing operations of the memory system of FIG. 1.

FIG. 2 is a timing diagram illustrating a data write operation and a packet transmission operation performed in the memory system 100 of FIG. 1. FIG. 3A is a diagram for describing the data write operation performed in the first operation mode. FIG. 3B is a diagram for describing the packet transmission operation performed in the second operation mode. In FIG. 2, "CS," "CMD," "ADDR" and "DQ" represents selection signals, commands, addresses and data, respectively. The "CS," "CMD," "ADDR" and "DQ" may be provided via a selection pin, a command pin, an address pin and a data pin, respectively. In certain instances, DQ may represent data destined for memory cells, while in other instances DQ may represent a packet.

Referring to FIGS. 2 and 3A, at time t1, the first signal CS0 is activated (e.g., "CS"=0), and the memory system 100 operates in the first operation mode.

The memory controller 130 generates the first command and the first address in the first operation mode. In an example of FIGS. 2 and 3A, the first command may be a write command WCMD1, and the first address may be a write address WADDR1. When the data write operation is required, the memory controller 130 may further generate write data WDAT to be stored in the first memory device 110.

At time t1, the memory controller 130 transmits the first signal CS0, the write command WCMD1 and the write address WADDR1 to the first memory device 110 through the first channel 150. Within a first period T1 after the first signal CS0, the write command WCMD1 and the write address WADDR1 are transmitted to the first memory device 110 through the first channel 150 (e.g., at time t2), the memory controller 130 transmits the write data WDAT to the first memory device 110 through the first channel 150. As such, the memory controller 130 may transmit the first signal CS0, the write command WCMD1, the write address WADDR1 and the write data WDAT to the first memory device 110 based on the operation timing of the deterministic interface (e.g., based on an operation timing scheme of a standard DRAM or other volatile memory interface). The write data WDAT may be stored in the first memory device 110 based on the write command WCMD1 and the write address WADDR1.

Referring to FIGS. 2 and 3B, at time t3, the second signal CS1 is activated (e.g., "CS"=1), and the memory system 100 operates in the second operation mode.

The memory controller 130 generates the second command and the second address in the second operation mode. In an example of FIGS. 2 and 3B, the second command may be a write command WCMD2, and the second address may be a write address WADDR2 (though in this example and in certain embodiments, the write address WADDR2 is not used). When the packet transmission operation is required, the memory controller 130 may further generate a transmission packet to be transmitted to the second memory device 120. For example, the transmission packet may be a write transmission packet WTXPKT.

At time t3, the memory controller 130 transmits the second signal CS1, the write command WCMD2 and the write address WADDR2 to the memory abstraction block 140 through the first channel 150. Within the first period T1 after the second signal CS1, the write command WCMD2 and the write address WADDR2 are transmitted to the memory abstraction block 140 through the first channel 150 (e.g., at time t4), the memory controller 130 transmits the transmission packet (e.g., the write transmission packet WTXPKT) to the memory abstraction block 140 through the first channel 150. As such, the memory controller 130 may transmit the second signal CS1, the write command WCMD2, the write address WADDR2 and the transmission packet (e.g., the write transmission packet WTXPKT) to the memory abstraction block 140 based on the operation timing of the deterministic interface (e.g., based on an operation timing scheme of a standard DRAM or other volatile memory interface). In this manner, the same interface and same communication protocol may be used to send commands to two different types of memory devices over the same channel.

The transmission packet (e.g., the write transmission packet WTXPKT) may be stored in a storage block (e.g., a storage circuit such as element 144 in FIG. 11) included in the memory abstraction block 140. At a time after time t4, the memory abstraction block 140 may strip the transmission packet, for example, of header code and tail code (described in more detail below), and transmit certain of information sWTXPKT (e.g., information for storing data in the second memory device 120) of the transmission packet to the second memory device 120 based on the operation timing of the nondeterministic interface. For example, the memory abstraction block 140 may include circuitry that is configured to receive commands and packets from the memory controller 130, to strip the packets based on the commands, and to communicate with the second memory device 120 using the information in the packet in order to access the second memory 120. This procedure is described in greater detail below.

Referring to FIG. 2, at time t5, similarly to at time t3, the second signal CS1 is activated (e.g., "CS"=1), and the memory system 100 operates in the second operation mode. The memory controller 130 generates a write command WCMD3 in the second operation mode. The memory controller 130 may further generate a transmission packet to be transmitted to the second memory device 120. For example, the transmission packet may be a read transmission packet RTXPKT. In certain embodiments, as shown in FIG. 2, the memory controller 130 may also generate a write address WADDR3. However, in other embodiments, this address need not be used At time t5, the memory controller 130 transmits the second signal CS1, the write command WCMD3 and the write address WADDR3 to the memory abstraction block 140 through the first channel 150. Within the first period T1 after the second signal CS1, the write command WCMD3 and the write address WADDR3 are transmitted to the memory abstraction block 140 through the first channel 150 (e.g., at time t6), the memory controller 130 transmits the transmission packet (e.g., the read transmission packet RTXPKT) to the memory abstraction block 140 through the first channel 150. As such, the memory controller 130 may transmit the second signal CS1, the write command WCMD3, the write address WADDR3 and the transmission packet (e.g., the read transmission packet RTXPKT) to the memory abstraction block 140 based on the operation timing of the deterministic interface (e.g., based on an operation timing scheme of a standard DRAM or other volatile memory interface).

The transmission packet (e.g., the read transmission packet RTXPKT) may be stored in the storage block included in the memory abstraction block 140. At a time after time t6, the memory abstraction block 140 may strip the transmission packet and transmit certain of information (e.g., information for retrieving data from the second memory device 120) of the transmission packet to the second memory device 120 based on the operation timing of the nondeterministic interface.

The write commands WCMD1, WCMD2 and WCMD3 in FIG. 2 may be substantially the same as each other. For example, each of the write commands WCMD1, WCMD2 and WCMD3 in FIG. 2 may correspond to a write command that is used in the deterministic interface (e.g., the DRAM interface). However, an operation of the memory system 100 based on the write command WCMD1 may not be exactly the same as an operation of the memory system 100 based on the write commands WCMD2 and WCMD3. In the first operation mode, the write command WCMD1 may be used for storing the write data WDAT in the first memory device 110. In the second operation mode, the write commands WCMD2 and WCMD3 may be used for transmitting the packet from the memory controller 130 to the memory abstraction block 140.

In the first operation mode, the data write operation for the first memory device 110 may be directly performed based on the write command WCMD1, and thus the write address WADDR1 may directly indicate a region of the first memory device 110 in which the write data WDAT is to be stored. In the second operation mode, when the packet transmitted to the memory abstraction block 140 is the write transmission packet WTXPKT, the data write operation for the second memory device 120 may be performed based on the information sWTXPKT (e.g., information for storing data in the second memory device 120) of the write transmission packet WTXPKT. In the second operation mode, when the packet transmitted to the memory abstraction block 140 is the read transmission packet RTXPKT, a data read operation for the second memory device 120 may be performed based on the information (e.g., information for retrieving data from the second memory device 120) of the read transmission packet RTXPKT. As such, in the second operation mode, the data read/write operations for the second memory device 120 may not be directly performed based on the write commands WCMD2 and WCMD3.

As will be described below with reference to FIGS. 4A and 4B, each of the transmission packets WTXPKT and RTXPKT (described below) may include a command code, an address code and/or data. The data write operation for the second memory device 120 and the data read operation for the second memory device 120 may be performed based on the command code, the address code and/or the data included in each of the transmission packets WTXPKT and RTXPKT. Thus, each of the write addresses WADDR2 and WADDR3, if used, may not directly indicate a region of the second memory device 120 in which a respective one of the transmission packets WTXPKT and RTXPKT is to be stored. Each of the write addresses WADDR2 and WADDR3 may therefore be dummy addresses that can have any value. According to example embodiments, the generation of the write addresses WADDR2 and WADDR3 may be omitted.

Figure 4A:
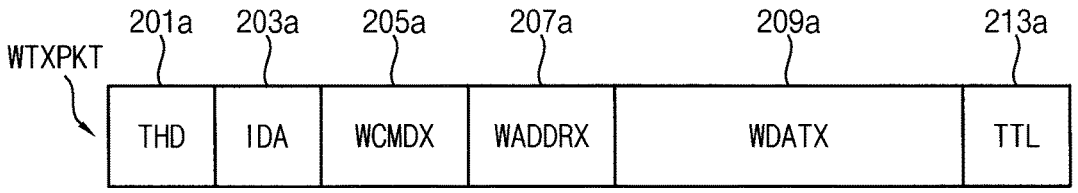
FIGS. 4A and 4B are diagrams illustrating examples of a transmission packet in FIG. 2.
Figure 4B:
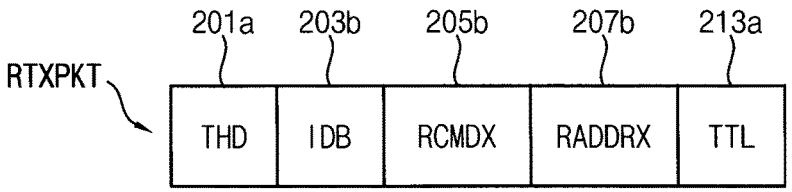

FIGS. 4A and 4B are diagrams illustrating examples of a transmission packet in FIG. 2.

Referring to FIG. 4A, a transmission packet of FIG. 4A may be a write transmission packet (e.g., WTXPKT) to store write data 209a in the second memory device 120. In this case, the write transmission packet may include a transmission header code 201a, an identification (ID) code 203a, a write command code 205a, a write address code 207a, the write data 209a and a transmission tail code 213a. The data write operation for the second memory device 120 may be performed after the write transmission packet is received by the memory abstraction block 140 and is processed by the memory abstraction block 140. For example, in certain embodiments, after receiving the write transmission packet, the transmission header code 201a and the transmission tail code 213a are stripped, and the remaining information in the packet is used to access the second memory device 120 according to a timing scheme and communication protocol used for that memory device, and using a type of access command supported by that device. For example, the identification (ID) code 203a may be stored in a storage at the memory abstraction block 140 and the write command code 205a, the write address code 207a, and the write data 209a may be transmitted to the second memory device 120. The write data 209a may be stored in the second memory device 120 based on the write command code 205a and the write address code 207a. For example, this may be accomplished according to a standard write protocol used for the type of memory device of the second memory device 120. In one embodiment, the memory abstraction block 140 includes circuitry configured to perform the reception and stripping of the write transmission packet, and to control access to the second memory device 120 using the contents of the write transmission packet according to a standard memory access protocol of the second memory device 120.

Referring to FIG. 4B, a transmission packet of FIG. 4B may be a read transmission packet (e.g., RTXPKT) to retrieve read data from the second memory device 120. In this case, the read transmission packet may include the transmission header code 201a, an ID code 203b, a read command code 205b, a read address code 207b and the transmission tail code 213a. The data read operation for the second memory device 120 may be performed when the read transmission packet is received by the memory abstraction block 140 and is processed by the memory abstraction block 140. For example, in certain embodiments, after receiving the read transmission packet, the transmission header code 201a and the transmission tail code 213a are stripped, and the remaining information in the packet is used to access the second memory device 120. For example, the identification (ID) code 203b may be stored in a storage at the memory abstraction block 140 and the read command code 205b, and the read address code 207b may be transmitted to the second memory device 120. For example, this may be accomplished according to a standard read protocol used for the type of memory device of the second memory device 120. In one embodiment, the memory abstraction block 140 includes circuitry configured to perform the reception and stripping of the read transmission packet, and to control access to the second memory device 120 using the contents of the read transmission packet according to a standard memory access protocol of the second memory device 120.

In certain embodiments, for either read or write operations for the second memory device 120, the identification (ID) code (203a, 203b) is stored at the memory abstraction block 140, and may be used after the read or write operation in the second memory device 120 is complete to re-associate the written or read data with the original command sent from the memory controller 130.

Although not illustrated in FIGS. 4A and 4B, the transmission packet may further include a code for a quality of service (QoS), an error correction code (ECC), etc.

Figure 5:
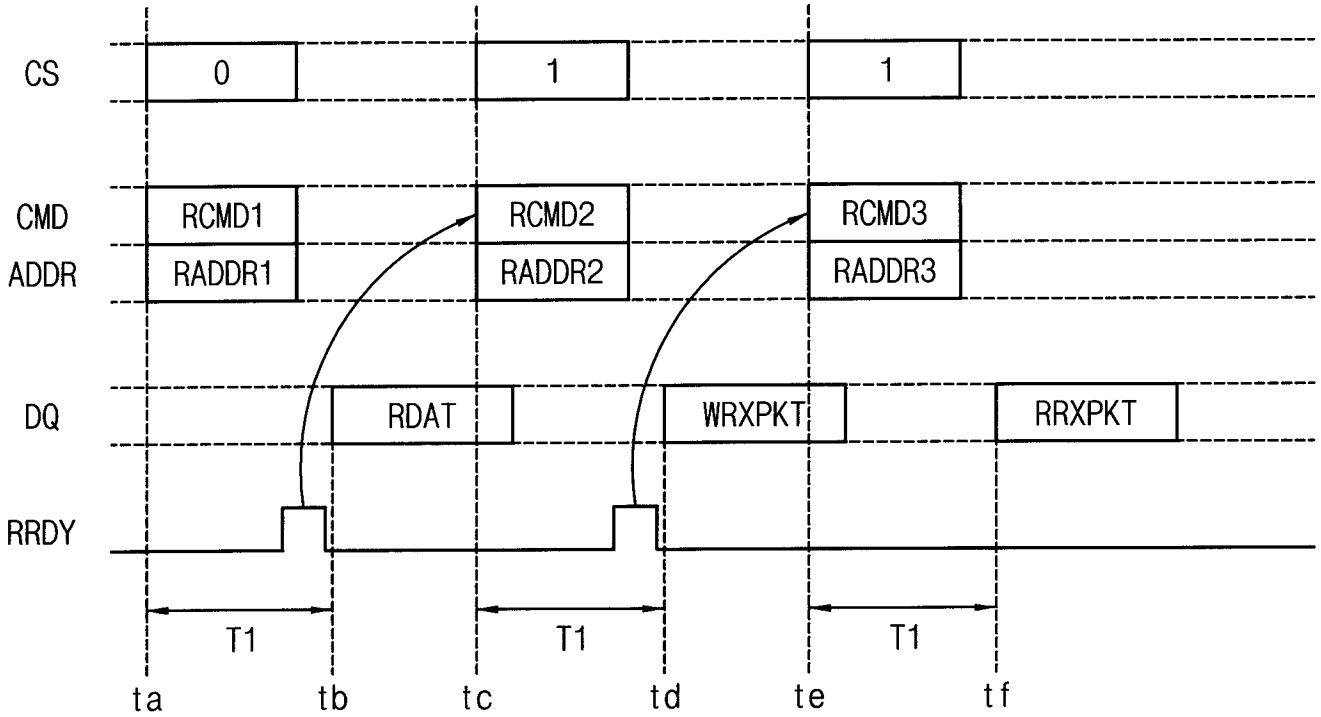
FIGS. 5, 6A, and 6B are diagrams for describing operations of the memory system of FIG. 1.
Figure 6A:
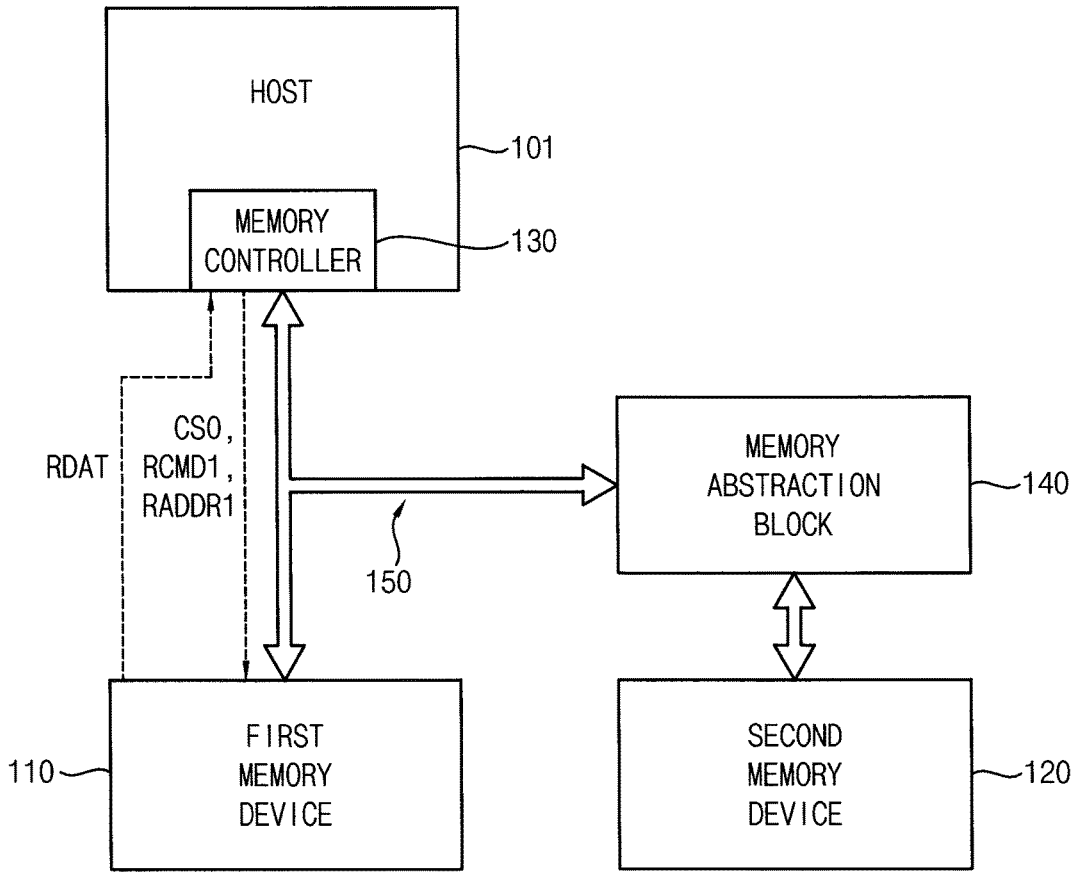
Figure 6B:
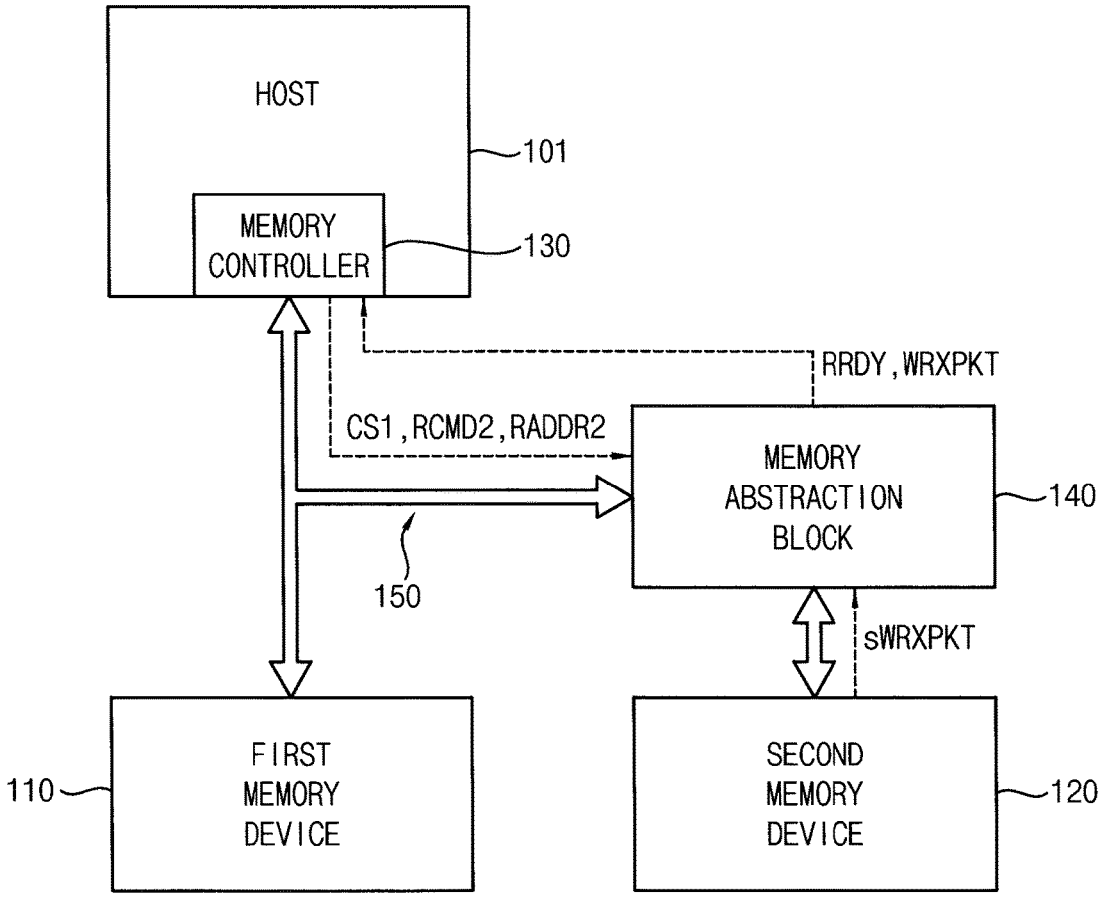

FIGS. 5, 6A and 6B are diagrams for describing exemplary operations of the memory system of FIG. 1.

FIG. 5 is a timing diagram illustrating a data read operation and a packet reception operation performed in the memory system 100 of FIG. 1. FIG. 6A is a diagram for describing the data read operation performed in the first operation mode. FIG. 6B is a diagram for describing the packet reception operation performed in the second operation mode. In FIG. 5, "CS," "CMD," "ADDR," "DQ" and "RRDY" represents selection signals, commands, addresses, data and read wait signals, respectively. The "CS," "CMD," "ADDR," "DQ" and "RRDY" may be provided via a selection pin, a command pin, an address pin, a data pin and an additional pin, respectively.

Referring to FIGS. 5 and 6A, at time ta, the first signal CS0 is activated (e.g., "CS"=0), and the memory system 100 operates in the first operation mode.

The memory controller 130 generates the first command and the first address in the first operation mode. In an example of FIGS. 5 and 6A, the first command may be a read command RCMD1, and the first address may be a read address RADDR1.

At time ta, the memory controller 130 transmits the first signal CS0, the read command RCMD1 and the read address RADDR1 to the first memory device 110 through the first channel 150. Within the first period T1 after the first signal CS0, the read command RCMD1 and the read address RADDR1 are transmitted to the first memory device 110 through the first channel 150 (e.g., at time tb), the memory controller 130 receives read data RDAT from the first memory device 110 through the first channel 150. As such, the memory controller 130 may transmit the first signal CS0, the read command RCMD1, and the read address RADDR1 to the first memory device 110, and may receive the read data RDAT from the first memory device 110 based on the operation timing of the deterministic interface. The read data RDAT may be output from the first memory device 110 based on the read command RCMD1 and the read address RADDR1.

Referring to FIGS. 5 and 6B, before time tc, the memory abstraction block 140 receives a reception packet from the second memory device 120 based on the operation timing of the nondeterministic interface. For example, the reception packet may be a write reception packet WRXPKT including a result of the data write operation (e.g., information that write data is successfully stored). The reception packet (e.g., the write reception packet WRXPKT) may be stored in the storage block (e.g., a storage circuit such as element 144 in FIG. 11) included in the memory abstraction block 140. The memory abstraction block 140 generates a read wait signal RRDY indicating that the reception packet (e.g., the write reception packet WRXPKT) is received from the second memory device 120 and is stored in the memory abstraction block 140. For example, the read wait signal RRDY may be activated (e.g., toggled) after the reception packet (e.g., the write reception packet WRXPKT) is stored in the memory abstraction block 140.

At time tc, the second signal CS1 is activated (e.g., "CS"=1), and the memory system 100 operates in the second operation mode. The memory controller 130 generates the second command and the second address based on the read wait signal RRDY in the second operation mode. In an example of FIGS. 5 and 6B, the second command may be a read command RCMD2, and the second address may be a read address RADDR2.

At time tc, the memory controller 130 transmits the second signal CS1, the read command RCMD2 and the read address RADDR2 to the memory abstraction block 140 through the first channel 150. Within the first period T1 after the second signal CS1, the read command RCMD2 and the read address RADDR2 are transmitted to the memory abstraction block 140 through the first channel 150 (e.g., at time td), the memory controller 130 receives the reception packet (e.g., the write reception packet WRXPKT) from the memory abstraction block 140 through the first channel 150. As such, the memory controller 130 may transmit the second signal CS1, the read command RCMD2 and the read address RADDR2 to the memory abstraction block 140, and may receive the reception packet (e.g., the write reception packet WRXPKT) from the memory abstraction block 140 based on the operation timing of the deterministic interface. In some embodiments, the read address RADDR2 may be a dummy address or may be omitted.

Referring to FIG. 5, before time te, the memory abstraction block 140 receives a reception packet from the second memory device 120 based on the operation timing of the nondeterministic interface. For example, the reception packet may be a read reception packet RRXPKT including a result of the data read operation (e.g., read data). The reception packet (e.g., the read reception packet RRXPKT) may be stored in the storage block (e.g., a storage circuit such as element 144 in FIG. 11) included in the memory abstraction block 140. The memory abstraction block 140 generates the read wait signal RRDY indicating that the reception packet (e.g., the read reception packet RRXPKT) is stored in the memory abstraction block 140. For example, the read wait signal RRDY may be activated (e.g., toggled) after the reception packet (e.g., the read reception packet RRXPKT) is stored in the memory abstraction block 140.

At time te, similarly to at time tc, the second signal CS1 is activated (e.g., "CS"=1), and the memory system 100 operates in the second operation mode. The memory controller 130 generates a read command RCMD3 and a read address RADDR3 based on the read wait signal RRDY in the second operation mode.

At time te, the memory controller 130 transmits the second signal CS1, the read command RCMD3 and the read address RADDR3 to the memory abstraction block 140 through the first channel 150. Within the first period T1 after the second signal CS1, the read command RCMD3 and the read address RADDR3 are transmitted to the memory abstraction block 140 through the first channel 150 (e.g., at time tf), the memory controller 130 receives the reception packet (e.g., the read reception packet RRXPKT) from the memory abstraction block 140 through the first channel 150. As such, the memory controller 130 may transmit the second signal CS1, the read command RCMD3 and the read address RADDR3 to the memory abstraction block 140, and may receive the reception packet (e.g., the read reception packet RRXPKT) from the memory abstraction block 140 based on the operation timing of the deterministic interface. In some embodiments, the read address RADDR3 may be a dummy address or may be omitted.

The read commands RCMD1, RCMD2 and RCMD3 in FIG. 5 may be substantially the same as each other. For example, each of the read commands RCMD1, RCMD2 and RCMD3 in FIG. 5 may correspond to a read command of the same type that is used in the deterministic interface (e.g., the DRAM interface). However, an operation of the memory system 100 based on the read command RCMD1 may not be exactly the same as an operation of the memory system 100 based on the read commands RCMD2 and RCMD3. In the first operation mode, the read command RCMD1 may be used for retrieving the read data RDAT from the first memory device 110. In the second operation mode, the read commands RCMD2 and RCMD3 may be used for receiving the packet from the memory abstraction block 140 to the memory controller 130.

In the first operation mode, the data read operation for the first memory device 110 may be directly performed based on the read command RCMD1, and thus the read address RADDR1 may directly indicate a region of the first memory device 110 in which the read data RDAT is stored. In the second operation mode, when the packet received from the memory abstraction block 140 is the write reception packet WRXPKT, the memory controller 130 may recognize a result of the data write operation for the second memory device 120 based on information sWRXPKT (e.g., information that write data is successfully stored in the second memory device 120) of the write reception packet WRXPKT. In the second operation mode, when the packet received from the memory abstraction block 140 is the read reception packet RRXPKT, the memory controller 130 may recognize a result of the data read operation for the second memory device 120 based on information (e.g., read data) of the read reception packet RRXPKT. As such, in the second operation mode, the data read/write operations for the second memory device 120 may not be directly performed based on the read commands RCMD2 and RCMD3.

As will be described below with reference to FIGS. 7A and 7B, each of the reception packets WRXPKT and RRXPKT may include data or a notification code. A result of the data write operation for the second memory device 120 or a result of the data read operation for the second memory device 120 may be provided to the memory controller 130 based on the data and/or the notification code included in each of the reception packets WRXPKT and RRXPKT. As discussed above, each of the read addresses RADDR2 and RADDR3 may not directly indicate a region of the second memory device 120 in which a respective one of the reception packets WRXPKT and RRXPKT is stored. Each of the read addresses RADDR2 and RADDR3 may have any value, and thus may constitute a dummy address. According to example embodiments, the generation of the read addresses RADDR2 and RADDR3 may be omitted.

Figure 7A:
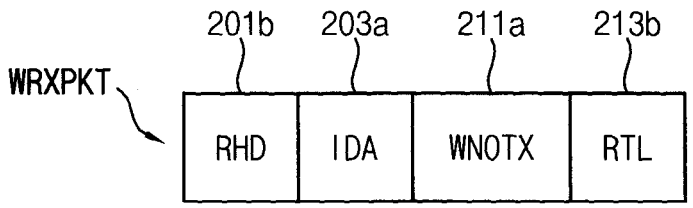
FIGS. 7A and 7B are diagrams illustrating examples of a reception packet in FIG. 5.
Figure 7B:
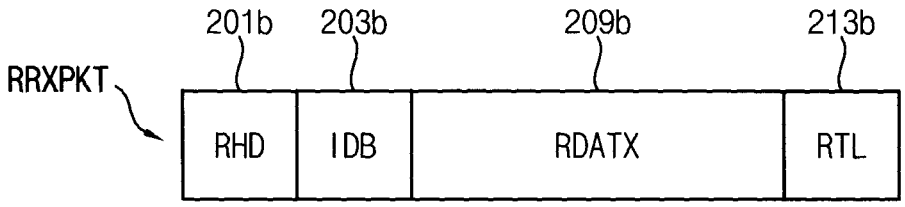

FIGS. 7A and 7B are diagrams illustrating examples of a reception packet in FIG. 5.

For example, each of FIGS. 7A and 7B represent exemplary packets that can be generated at the memory abstraction block 140 based on information received from the second memory device 120. Referring to FIG. 7A, a reception packet of FIG. 7A may be a write reception packet (e.g., WRXPKT) corresponding to the write transmission packet of FIG. 4A. In other words, the write transmission packet of FIG. 4A and write reception packet of FIG. 7A may be a pair of packets for the data write operation. In this case, the write reception packet may include a reception header code 201b, the ID code 203a, a write notification code 211a and a reception tail code 213b. The write notification code 211a may indicate whether the write data 209a in FIG. 4A is correctly stored in the second memory device 120. The ID code 203a included in the write reception packet of FIG. 7A may be substantially the same as the ID code 203a included in the write transmission packet of FIG. 4A. The memory controller 130 may determine, based on the write reception packet of FIG. 7, whether the write data 209a included in the write transmission packet of FIG. 4A is correctly stored in the second memory device 120.

Referring to FIG. 7B, a reception packet of FIG. 7B may be a read reception packet (e.g., RRXPKT) corresponding to the read transmission packet of FIG. 4B. In other words, the read transmission packet of FIG. 4B and read reception packet of FIG. 7B may be a pair of packets for the data read operation. In this case, the read reception packet may include the reception header code 201b, the ID code 203b, read data 209b and the reception tail code 213b. The ID code 203b included in the read reception packet of FIG. 7B may be substantially the same as the ID code 203b included in the read transmission packet of FIG. 4B. The read data 209b may be data that corresponds to the read command code 205b and the read address code 207b included in the read transmission packet of FIG. 4B. The memory controller 130 may receive the read reception packet of FIG. 7B as a result of the data read operation.

Figure 8:
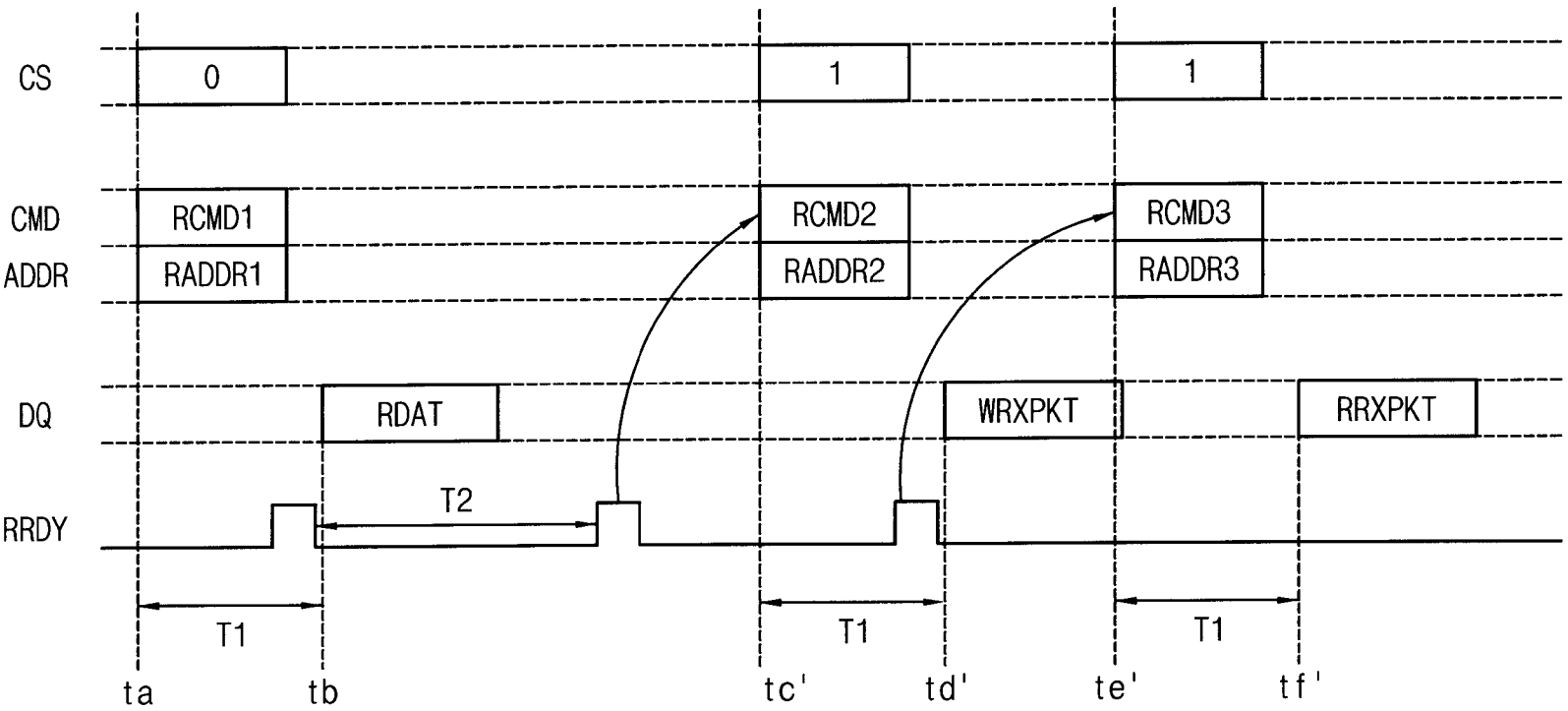
FIGS. 8 and 9 are diagrams for describing operations of the memory system of FIG. 1.
Figure 9:
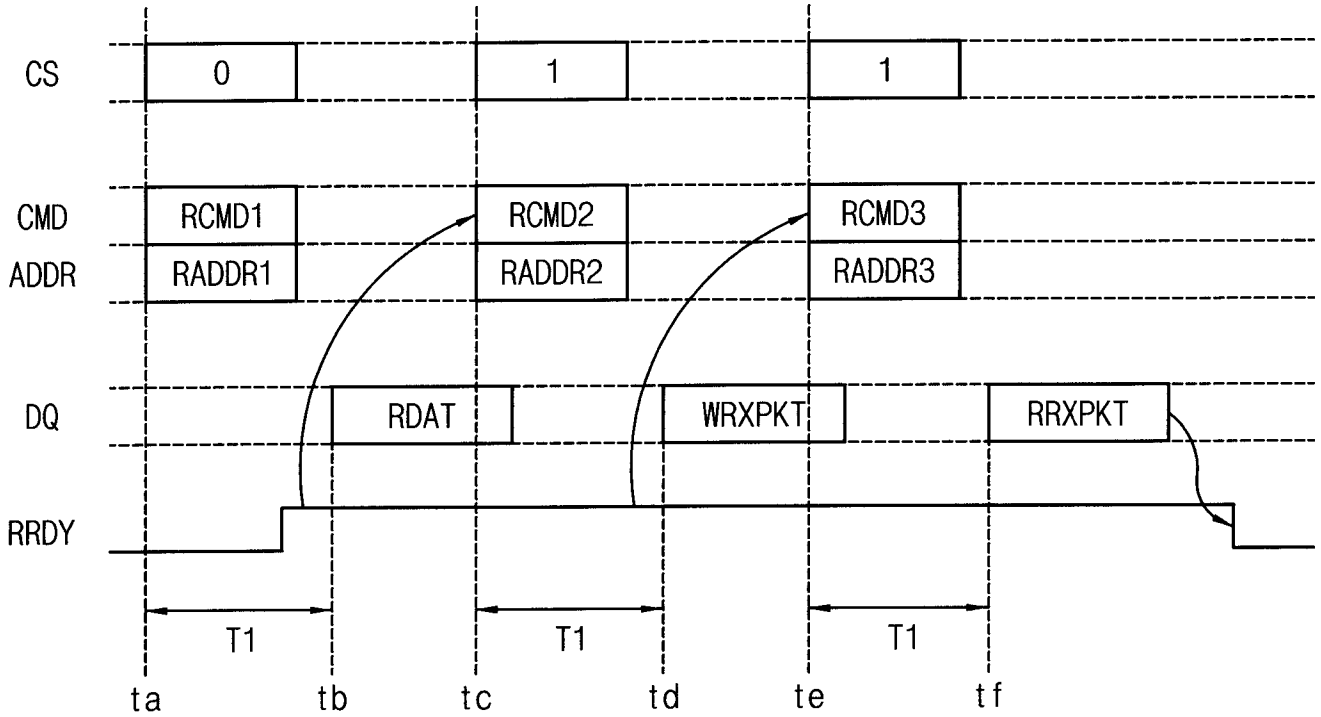

FIGS. 8 and 9 are diagrams for describing exemplary operations of the memory system of FIG. 1. FIGS. 8 and 9 are timing diagrams each of which illustrates the data read operation and the packet reception operation performed in the memory system 100 of FIG. 1.

The timing diagram of FIG. 8 may be substantially the same as the timing diagram of FIG. 5, except that time tc', time td', time te' and time tf' in FIG. 8 are delayed from time tc, time td, time te and time tf in FIG. 5, respectively, depending on the number of activations of the read wait signal RRDY.

Referring to FIG. 8, before time tc', the memory abstraction block 140 receives the reception packet (e.g., the write reception packet WRXPKT) from the second memory device 120 based on the operation timing of the nondeterministic interface. The memory abstraction block 140 generates the read wait signal RRDY indicating that the reception packet (e.g., the write reception packet WRXPKT) is stored in the memory abstraction block 140. For example, the read wait signal RRDY may be activated (e.g., toggled) after the reception packet (e.g., the write reception packet WRXPKT) is stored in the memory abstraction block 140. In some example embodiments, the read wait signal RRDY may be re-activated when the read command RCMD2 is not generated within a second period T2 after the read wait signal RRDY is activated.

The timing diagram of FIG. 9 may be substantially the same as the timing diagram of FIG. 5, except that an activation scheme of the read wait signal RRDY in FIG. 9 is different from an activation scheme of the read wait signal RRDY in FIG. 5.

Referring to FIG. 9, before time tc, the memory abstraction block 140 receives the reception packet (e.g., the write reception packet WRXPKT) from the second memory device 120 based on the operation timing of the nondeterministic interface. Before time te, the memory abstraction block 140 receives the reception packet (e.g., the read reception packet RRXPKT) from the second memory device 120 based on the operation timing of the nondeterministic interface. The memory abstraction block 140 generates the read wait signal RRDY indicating that the reception packets (e.g., WRXPKT and RRXPKT) are stored in the memory abstraction block 140. For example, the read wait signal RRDY may be activated (e.g., transitioned from a logic low level to a logic high level) after at least one of the reception packets (e.g., WRXPKT and RRXPKT) is stored in the memory abstraction block 140. In some example embodiments, the read wait signal RRDY may be deactivated (e.g., transitioned from the logic high level to the logic low level)

after the memory controller 130 receives all of the reception packets (e.g., WRXPKT and RRXPKT) based on the read commands RCMD2 and RCMD3.

Figure 10:
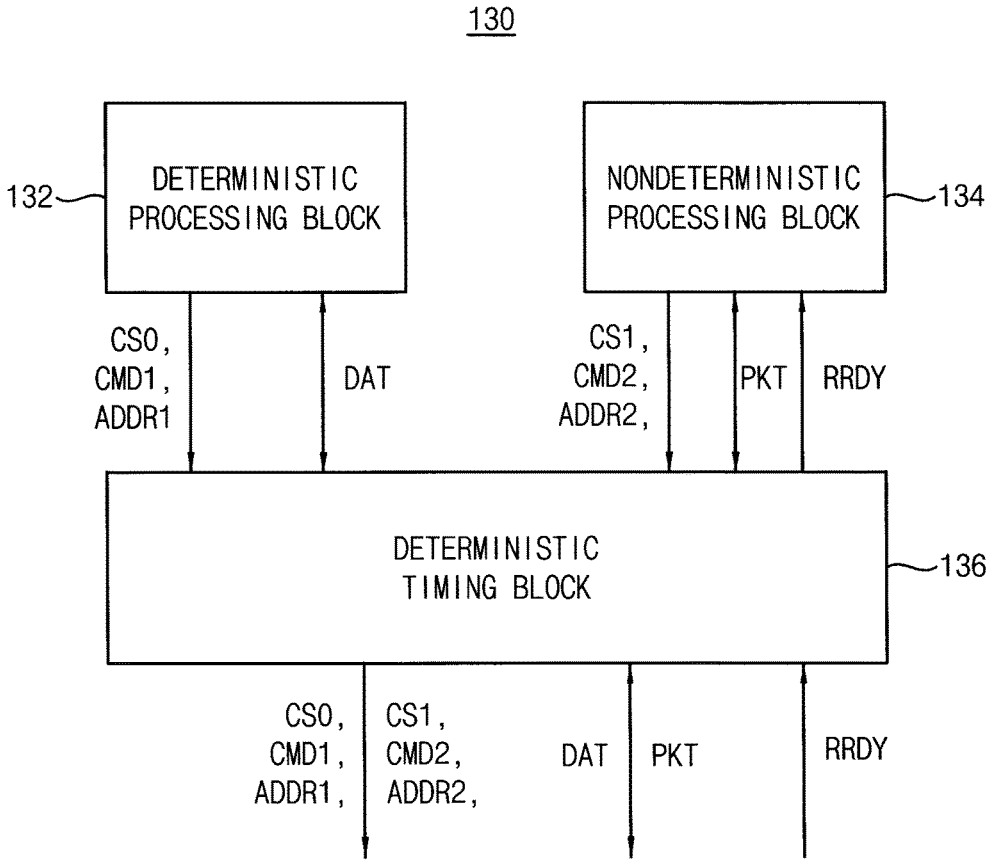
FIG. 10 is a block diagram illustrating an example of a memory controller included in the memory system of FIG. 1.

FIG. 10 is a block diagram illustrating an example of a memory controller included in the memory system of FIG. 1.

Referring to FIG. 10, the memory controller 130 may include a deterministic processing block 132, a nondeterministic processing block 134 and a deterministic timing block 136. Each of these blocks may be formed of circuits and thus may be referred to as a circuit. Further, the blocks may together or separately form one or a plurality of respective circuits, also described as interface circuits.

The deterministic processing block 132 may generate the first signal CS0, the first command CMD1 and the first address ADDR1 based on a first request from the host 101 in FIG. 1 in the first operation mode. The deterministic processing block 132 may exchange the first data DAT with the first memory device 110 in FIG. 1 through the deterministic timing block 136 in the first operation mode. For example, the deterministic processing block 132 may further generate the write data WDAT when the first command CMD1 is the write command. The deterministic processing block 132 may receive the read data RDAT from the first memory device 110 in FIG. 1 when the first command CMD1 is the read command.

The nondeterministic processing block 134 may generate the second signal CS1, the second command CMD2 and the second address ADDR2 based on a second request from the host 101 in FIG. 1 in the second operation mode. The nondeterministic processing block 134 may also generate and exchange the first packet PKT with the memory abstraction block 140 in FIG. 1 through the deterministic timing block 136 in the second operation mode. For example, the nondeterministic processing block 134 may further generate the transmission packet (e.g., WTXPKT or RTXPKT) when the second command CMD2 is the write command. The nondeterministic processing block 134 may receive the read wait signal RRDY and the reception packet (e.g., WRXPKT or RRXPKT) from the memory abstraction block 140 in FIG. 1 when the second command CMD2 is the read command.

The deterministic timing block 136 may output the first signal CS0, the first command CMD1 and the first address ADDR1 and may exchange the first data DAT with the first memory device 110 in FIG. 1 based on the operation timing of the deterministic interface in the first operation mode. The deterministic timing block 136 may output the second signal CS1, the second command CMD2 and the second address ADDR2, may receive the read wait signal RRDY and may exchange the first packet PKT with the memory abstraction block 140 in FIG. 1 based on the operation timing of the deterministic interface in the second operation mode.

Figure 11:
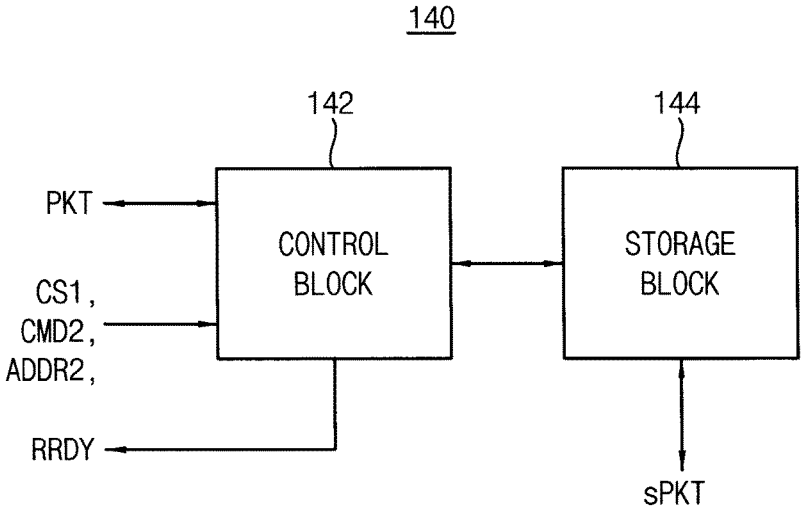
FIG. 11 is a block diagram illustrating an example of a memory abstraction block included in the memory system of FIG. 1.

FIG. 11 is a block diagram illustrating an example of a memory abstraction block included in the memory system of FIG. 1.

Referring to FIG. 11, the memory abstraction block 140 may include a control block 142 and a storage block 144. Each of these blocks may be formed of circuits and thus may be referred to as a circuit. Further, the blocks may together or separately form one or a plurality of respective circuits, also described as conversion circuits.

The control block 142 may receive the second signal CS1, the second command CMD2 and the second address ADDR2 in the second operation mode. The control block 142 may exchange the first packet PKT with the memory controller 130 in FIG. 1 in the second operation mode. For example, the control block 142 may include circuitry configured to receive the transmission packet (e.g., WTXPKT or RTXPKT) when the second command CMD2 is the write command, and in response to strip the header code and tail code from the packet and transmit certain contents of the package (e.g., a command, address, and data) to the second memory device 120 while sending the other contents (e.g., an ID code) to the storage block 144. The control block 142 may output the read wait signal RRDY and the reception packet (e.g., WRXPKT or RRXPKT) when the second command CMD2 is the read command.

The storage block 144 may store information from the first packet PKT. For example, the storage block 144 may store the ID code from the transmission packet TXPKT provided from the memory controller 130 in FIG. 1, and may then re-associate that ID code with received data or confirmation data when generating the reception packet RXPKT to be provided back to the memory controller 130 in FIG. 1.

Figure 12:
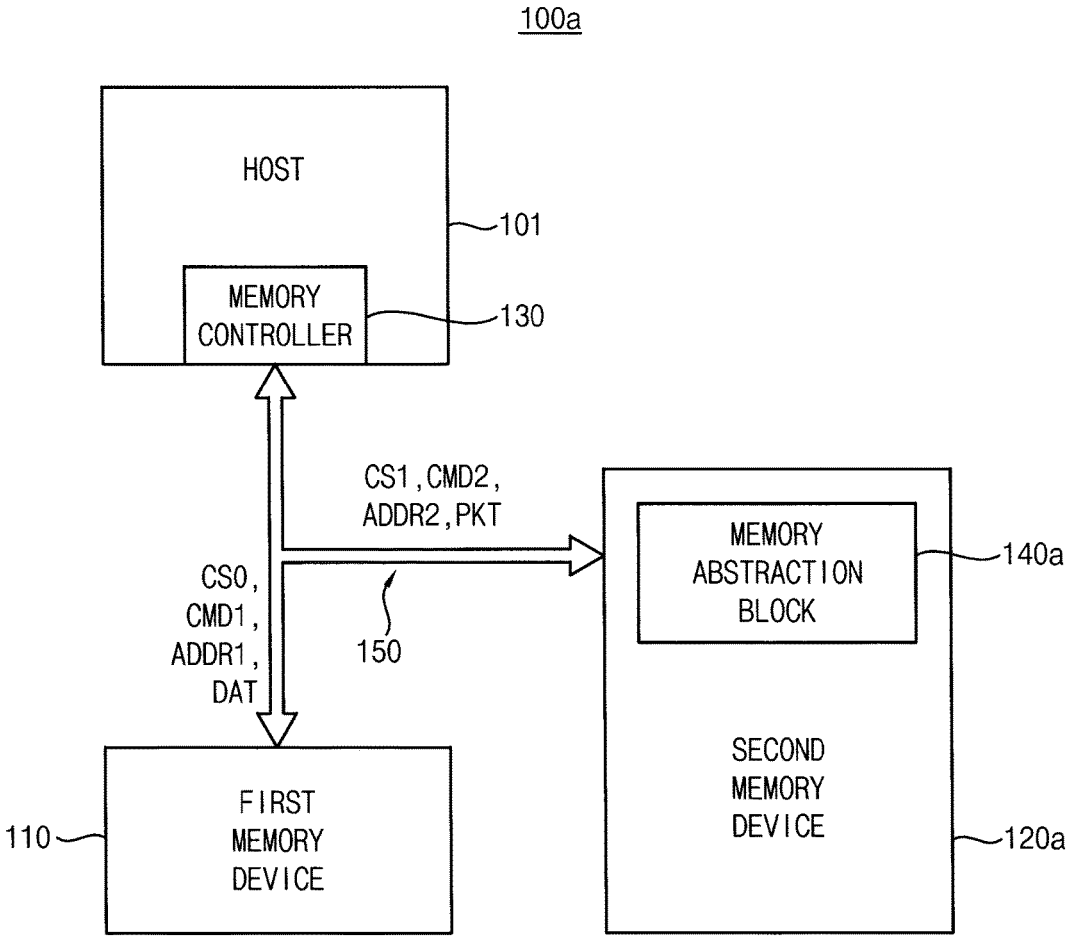
FIGS. 12, 13, and 14 are block diagrams illustrating memory systems according to example embodiments.
Figure 13:
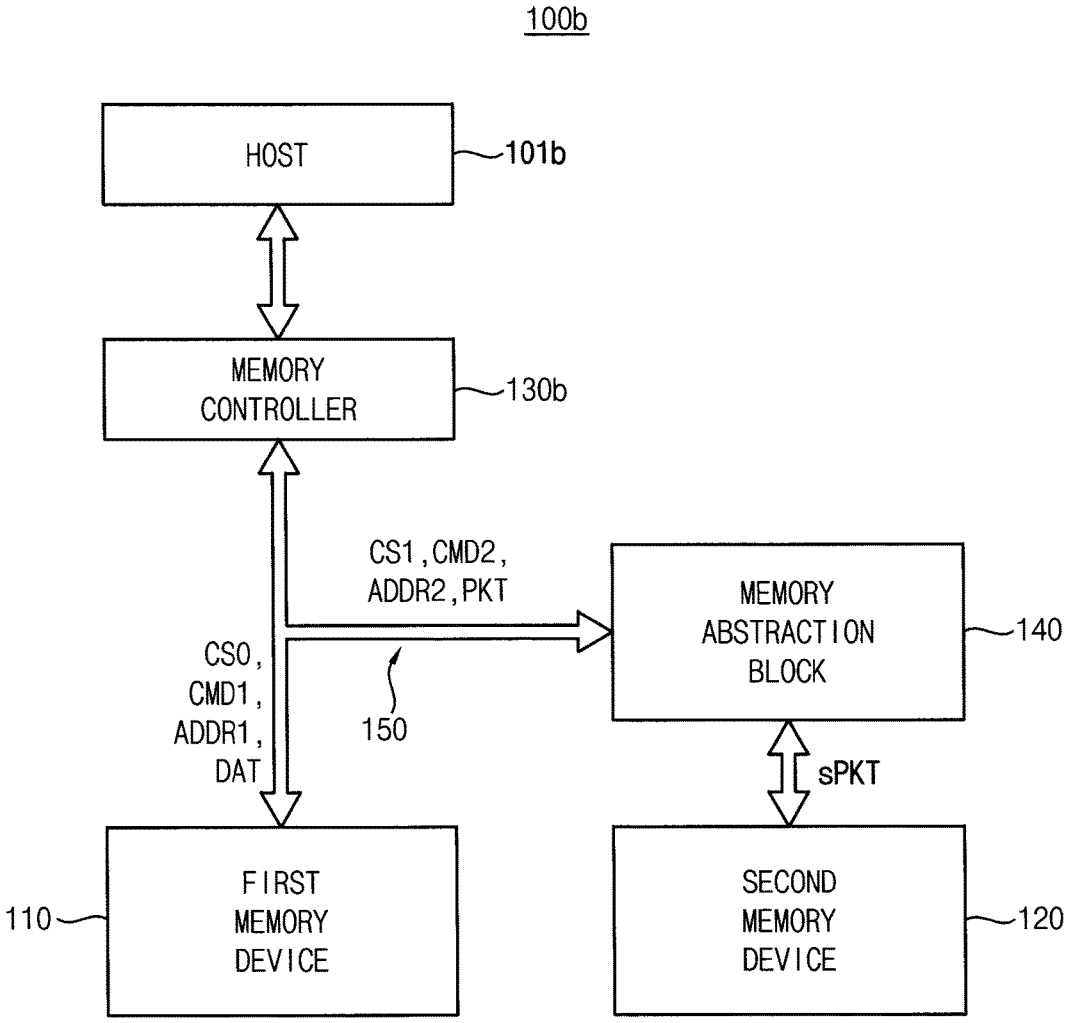
Figure 14:
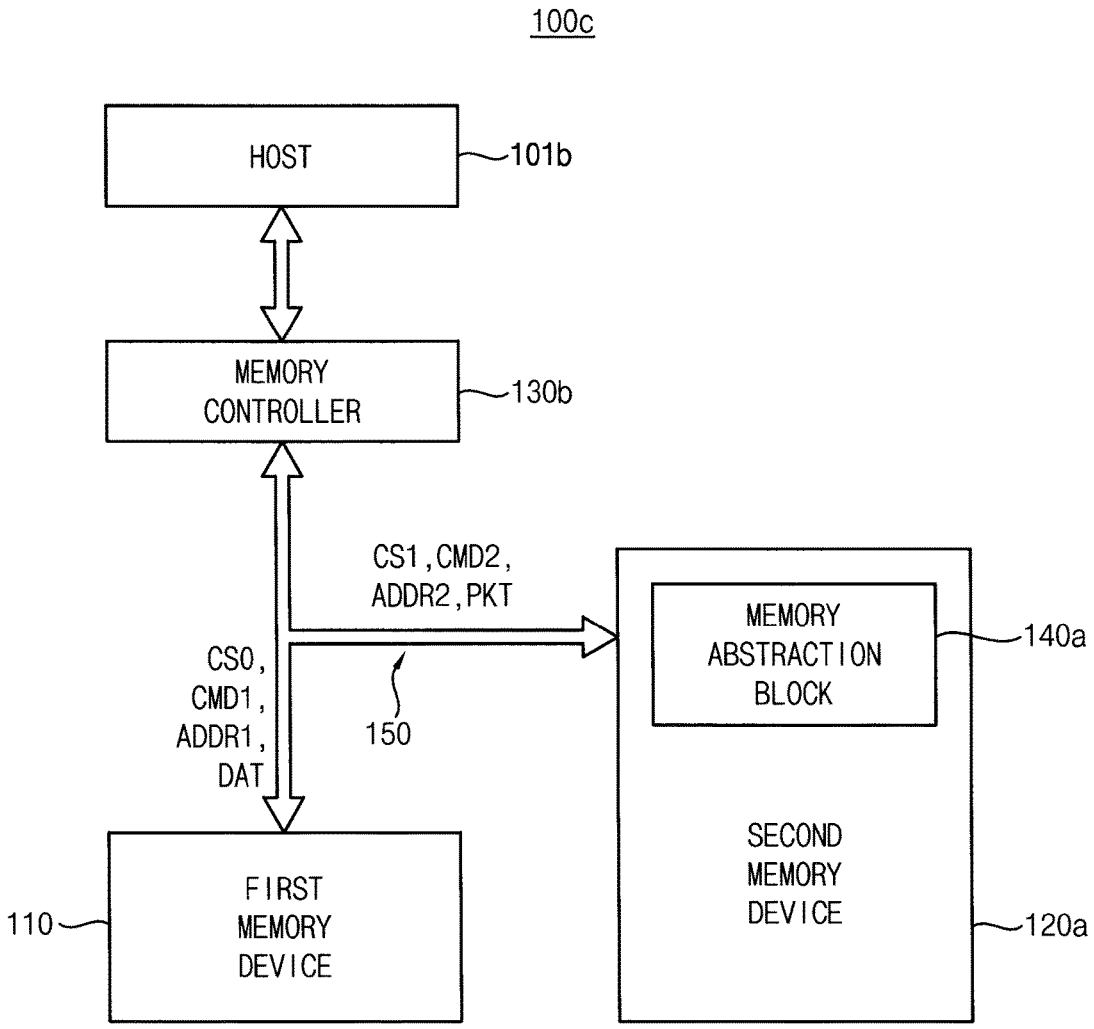

FIGS. 12, 13 and 14 are block diagrams illustrating memory systems according to example embodiments.

Referring to FIG. 12, a memory system 100a includes a first memory device 110, a second memory device 120a and a memory controller 130. The memory system 100a may further include a host 101 and a first channel 150.

The memory system 100a of FIG. 12 may be substantially the same as the memory system 100 of FIG. 1, except that a memory abstraction block 140a in FIG. 12 is disposed inside the second memory device 120a in FIG. 12.

The first memory device 110 operates based on the deterministic interface. The second memory device 120a operates based on the nondeterministic interface. The memory controller 130 operates based on the requests from the host 101. The memory controller 130 generates the first command CMD1 and the first address ADDR1 in the first operation mode and generates the second command CMD2 and the second address ADDR2 in the second operation mode. The memory controller 130 exchanges the first data DAT with the first memory device 110 through the first channel 150 based on the first command CMD1 and the first address ADDR1 in the first operation mode and exchanges the first packet PKT with the second memory device 120a through the memory abstraction block 140a and the first channel 150 based on the second command CMD2 in the second operation mode. The memory abstraction block 140a (e.g., a conversion circuit) is included in the second memory device 120a and controls the communication between the memory controller 130 and the second memory device 120a in the second operation mode. For example, the memory abstraction block 140a may be formed as part of the same integrated circuit on the same die as the second memory device. The memory controller 130 may be included in the host 101.

Referring to FIG. 13, a memory system 100b includes a first memory device 110, a second memory device 120, a memory controller 130b and a memory abstraction block 140. The memory system 100b may further include a host 101b and a first channel 150.

The memory system 100b of FIG. 13 may be substantially the same as the memory system 100 of FIG. 1, except that the memory controller 130b in FIG. 13 is separated from the host 101b in FIG. 13.

The first memory device 110 operates based on the deterministic interface. The second memory device 120 operates based on the nondeterministic interface. The memory controller 130b operates based on the requests from the host 101b. The memory controller 130b generates the first command CMD1 and the first address ADDR1 in the first operation mode and generates the second command CMD2 and the second address ADDR2 in the second operation mode. The memory controller 130b exchanges the first data DAT with the first memory device 110 through the first channel 150 based on the first command CMD1 and the first address ADDR1 in the first operation mode and exchanges the first packet PKT with the memory abstraction block 140 through the first channel 150 based on the second command CMD2 in the second operation mode. The memory abstraction block 140 is connected to the second memory device 120 and controls the communication between the memory controller 130b and the second memory device 120 in the second operation mode.

Referring to FIG. 14, a memory system 100c includes a first memory device 110, a second memory device 120a and a memory controller 130b. The memory system 100c may further include a host 101b and a first channel 150.

The memory system 100c of FIG. 14 may be substantially the same as the memory system 100 of FIG. 1, except that a memory abstraction block 140a in FIG. 14 is disposed inside the second memory device 120a in FIG. 14, and except that the memory controller 130b in FIG. 14 is separated from the host 101b in FIG. 14.

Figure 15:
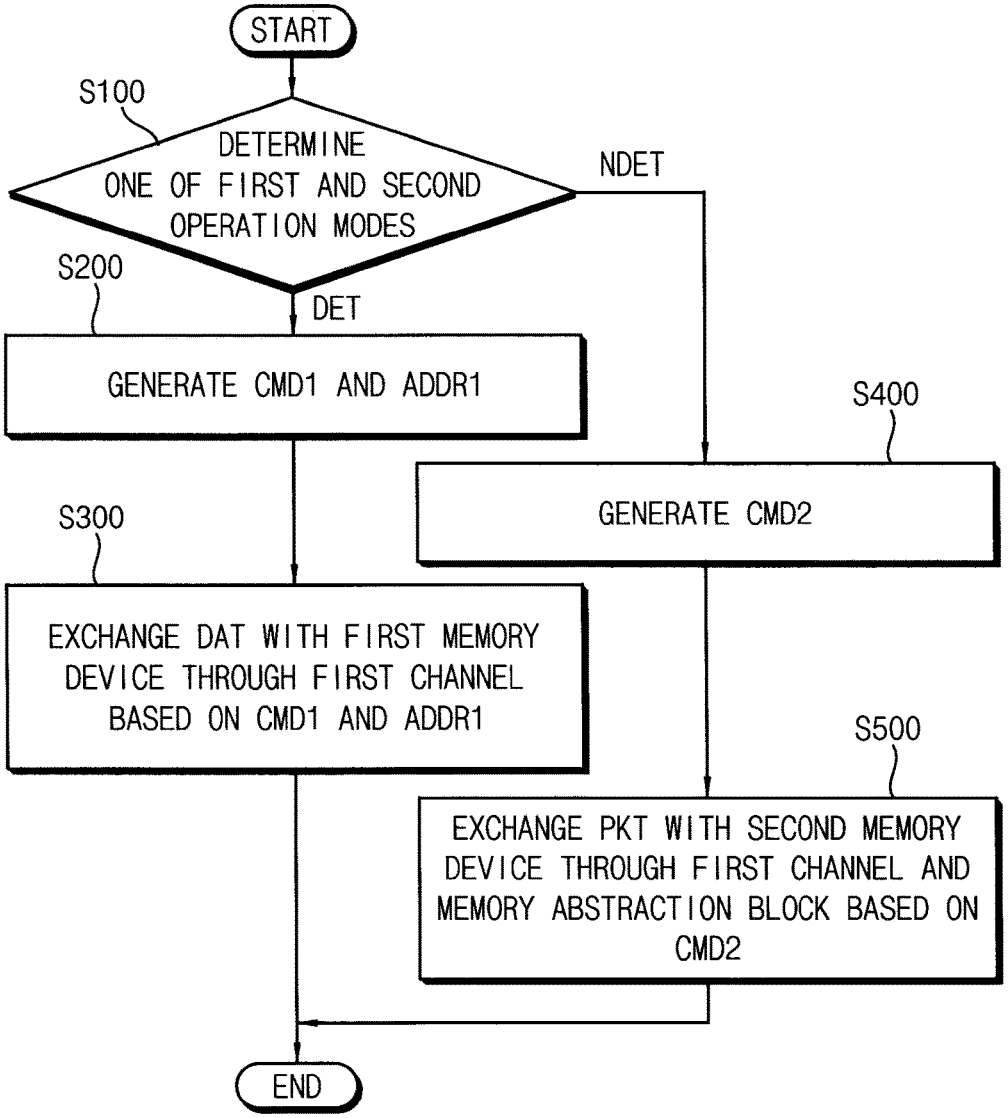
FIG. 15 is a flow chart illustrating a method of operating a memory system according to example embodiments.

FIG. 15 is a flow chart illustrating a method of operating a memory system according to example embodiments.

Referring to FIGS. 1 and 15, in the method of operating the memory system 100 according to one example embodiment, the operation mode of the memory system 100 is determined (step S100). The operation mode may include the first operation mode for accessing the first memory device 110 and the second operation mode for accessing the second memory device 120. The first memory device 110 operates based on the deterministic interface in which the data are transmitted to or received from the first memory device 110 within the first period after the commands are generated. The second memory device 120 operates based on the nondeterministic interface in which the packets including the data are transmitted to or received from the second memory device 120.

When the operation mode of the memory system 100 is determined to be the first operation mode (step S100: DET), the memory controller 130 generates the first command CMD1 and the first address ADDR1 (step S200). The memory controller 130 exchanges the first data DAT with the first memory device 110 through the first channel 150 based on the first command CMD1 and the first address ADDR1 (step S300).

When the operation mode of the memory system 100 is determined to be the second operation mode (step S100: NDET), the memory controller 130 generates the second command CMD2 (step S400). The memory controller 130 exchanges the first packet PKT with the second memory device 120 through the first channel 150 and the memory abstraction block 140 based on the second command CMD2 (step S500).

In some example embodiments, the memory controller 130 may further generate the first signal CS0 and the second signal CS1. The first operation mode may be enabled based on the first signal CS0, and the second operation mode may be enabled based on the second signal CS1.

In some example embodiments, the memory controller 130 may further generate the second address ADDR2 in the second operation mode. The memory controller 130 may exchange the first packet PKT with the second memory device 120 through the first channel 150 and the memory abstraction block 140 based on the second command CMD2 and the second address ADDR2. In one embodiment, the second address ADDR2 may not be sent separately, but may form part of the first packet PKT, to instruct the memory abstraction block 140 of an address for accessing the second memory device 120.

The memory system 100 includes the memory abstraction block 140 that controls the communication between the memory controller 130 and the second memory device 120 in the second operation mode. The memory abstraction block may be disposed outside the second memory device, as illustrated in FIG. 1, or may be disposed inside the second memory device, as illustrated in FIG. 12.

The memory system 100 that operates based on the method according to example embodiments may support both the deterministic interface and the nondeterministic interface based on one channel (e.g., the first channel 150) and one memory controller (e.g., the memory controller 130). For example, the memory controller 130 may exchange the first data DAT and the first packet PKT with the first memory device 110 and the second memory device 120, respectively, through the first channel 150. The first and second memory devices 110 and 120 may be different types of memory devices. Accordingly, the memory system 100 may include various memory devices having various latencies and may have a relatively improved performance.

Figure 16:
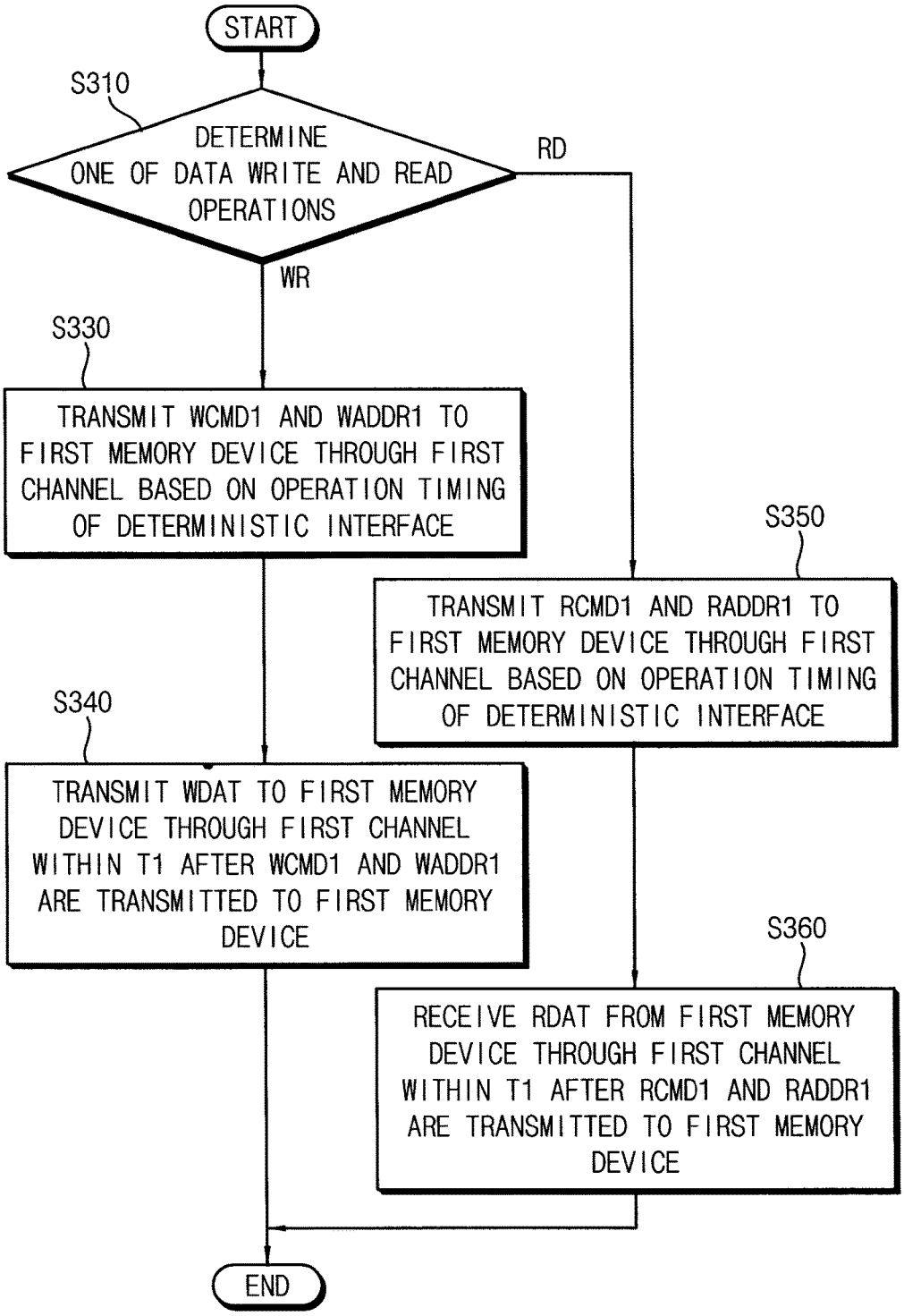
FIG. 16 is a flow chart illustrating an example of exchanging first data with a first memory device in FIG. 15.

FIG. 16 is a flow chart illustrating an example of exchanging first data with a first memory device in FIG. 15.

Referring to FIGS. 3A, 6A and 16, in the step S300, it may be determined whether the data write operation or the data read operation is performed (step S310).

When the data write operation is performed (step S310: WR), e.g., if the first command is the write command WCMD1, if the first address is the write address WADDR1, and if the first data is the write data WDAT, the memory controller 130 may transmit the write command WCMD1 and the write address WADDR1 to the first memory device 110 through the first channel 150 based on the operation timing of the deterministic interface (step S330). Within the first period T1 after the write command WCMD1 and the write address WADDR1 are transmitted to the first memory device 110 through the first channel 150, the memory controller 130 may transmit the write data WDAT to the first memory device 110 through the first channel 150 (step S340).

When the data read operation is performed (step S310: RD), e.g., if the first command is the read command RCMD1, if the first address is the read address RADDR1, and if the first data is the read data RDAT, the memory controller 130 may transmit the read command RCMD1 and the read address RADDR1 to the first memory device 110 through the first channel 150 based on the operation timing of the deterministic interface (step S350). Within the first period T1 after the read command RCMD1 and the read address RADDR1 are transmitted to the first memory device 110 through the first channel 150, the memory controller 130 may receive the read data RDAT from the first memory device 110 through the first channel 150 (step S360).

Figure 17:
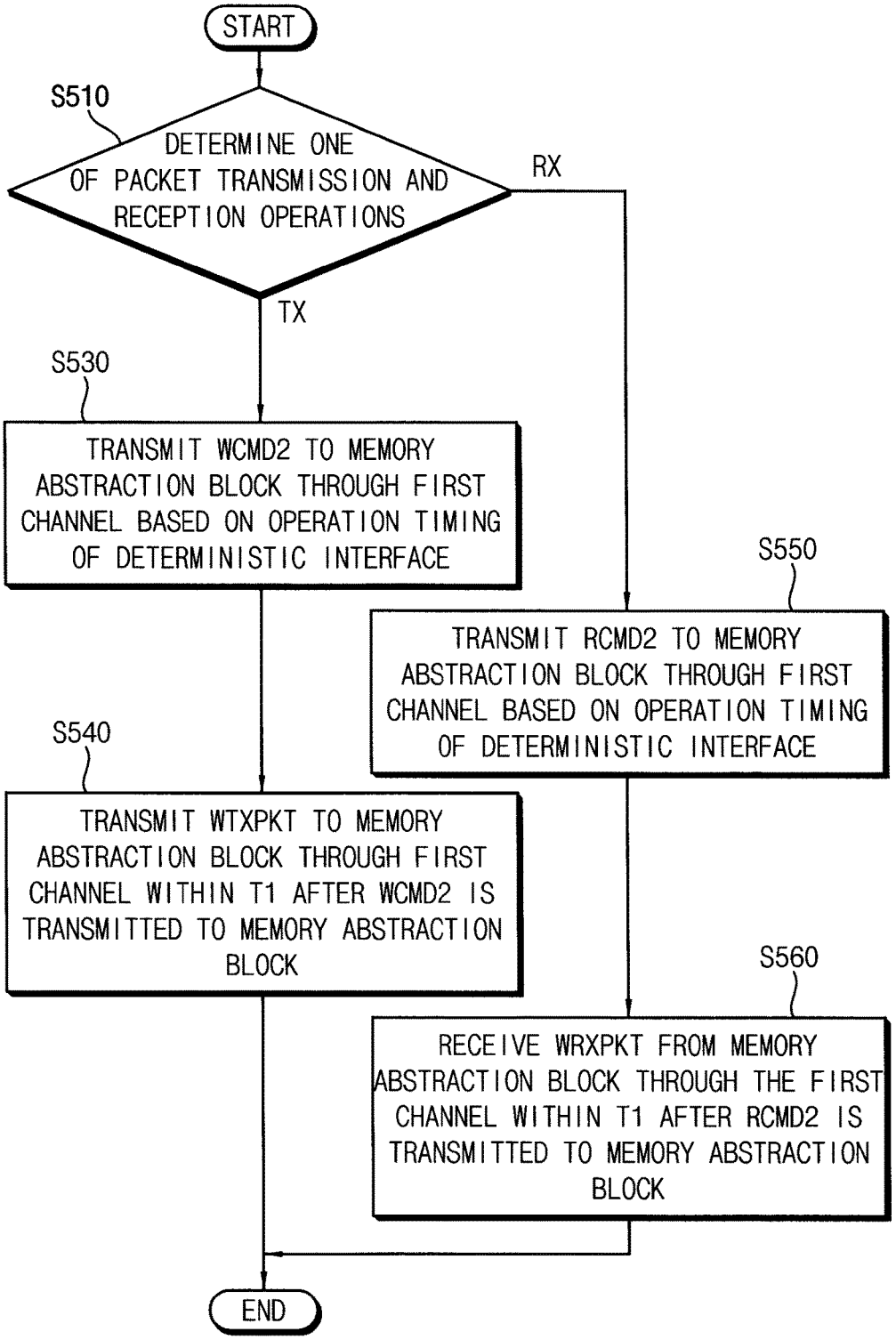
FIG. 17 is a flow chart illustrating an example of exchanging a first packet with a second memory device in FIG. 15.

FIG. 17 is a flow chart illustrating an example of exchanging a first packet with a second memory device in FIG. 15.

Referring to FIGS. 3B, 6B and 17, in the step S500, it may be determined whether the packet transmission operation or the packet reception operation for the data read operation or the data write operation is performed (step S510).

When the packet transmission operation for the data write operation is performed (step S510: TX), e.g., if the first command is the write command WCMD2, and if the first packet is the write transmission packet WTXPKT, the memory controller 130 may transmit the write command WCMD2 to the memory abstraction block 140 through the first channel 150 based on the operation timing of the deterministic interface (step S530). Within the first period T1 after the write command WCMD2 is transmitted to the memory abstraction block 140 through the first channel 150, the memory controller 130 may transmit the write transmission packet WTXPKT to the memory abstraction block 140 through the first channel 150 (step S540). The memory abstraction block 140 may transmit information (e.g., write data, write address code, etc.) from the write transmission packet WTXPKT to the second memory device 120 based on the operation timing of the nondeterministic interface.

In some example embodiments, the memory controller 130 may further transmit the write address WADDR2 to the memory abstraction block 140 through the first channel 150 based on the operation timing of the deterministic interface.

Although not illustrated in FIG. 17, when the packet transmission operation for the data read operation is performed (step S510: TX), e.g., if the first command is the write command WCMD3, and if the first packet is the read transmission packet RTXPKT, the memory controller 130 may transmit the write command WCMD3 to the memory abstraction block 140 through the first channel 150 based on the operation timing of the deterministic interface. Within the first period T1 after the write command WCMD3 is transmitted to the memory abstraction block 140 through the first channel 150, the memory controller 130 may transmit the read transmission packet RTXPKT to the memory abstraction block 140 through the first channel 150. The memory abstraction block 140 may transmit information (e.g., read address code, etc.) from the read transmission packet RTXPKT to the second memory device 120 based on the operation timing of the nondeterministic interface.

When the packet reception operation for the data write operation is performed (step S510: RX), e.g., if the first command is the read command RCMD2, and if the first packet is the write reception packet WRXPKT, the memory controller 130 may generate the read command RCMD2 based on the read wait signal RRDY. For example, the second memory device 120 may transmit the write reception packet WRXPKT to the memory abstraction block 140 based on the operation timing of the nondeterministic interface. The memory abstraction block 140 may generate the read wait signal RRDY indicating that the write reception packet WRXPKT is received from the second memory device 120 and is stored in the memory abstraction block 140. The memory controller 130 may generate and transmit the read command RCMD2 to the memory abstraction block 140 through the first channel 150 based on the operation timing of the deterministic interface (step S550). Within the first period T1 after the read command RCMD2 is transmitted to the memory abstraction block 140 through the first channel 150, the memory controller 130 may receive the write reception packet WRXPKT from the memory abstraction block 140 through the first channel 150 (step S560).

In some example embodiments, the memory controller 130 may further transmit the read address RADDR2 to the memory abstraction block 140 through the first channel 150 based on the operation timing of the deterministic interface.

Although not illustrated in FIG. 17, when the packet reception operation for the data read operation is performed (step S510: RX), e.g., if the first command is the read command RCMD3, and if the first packet is the read reception packet RRXPKT, the memory controller 130 may generate the read command RCMD3 based on the read wait signal RRDY. For example, the second memory device 120 may transmit the read reception packet RRXPKT to the memory abstraction block 140 based on the operation timing of the nondeterministic interface. The memory abstraction block 140 may generate the read wait signal RRDY indicating that the read reception packet RRXPKT is received from the second memory device 120 and is stored in the memory abstraction block 140. The memory controller 130 may generate and transmit the read command RCMD3 to the memory abstraction block 140 through the first channel 150 based on the operation timing of the deterministic interface. Within the first period T1 after the read command RCMD3 is transmitted to the memory abstraction block 140 through the first channel 150, the memory controller 130 may receive the read reception packet RRXPKT from the memory abstraction block 140 through the first channel 150.

Figure 18:
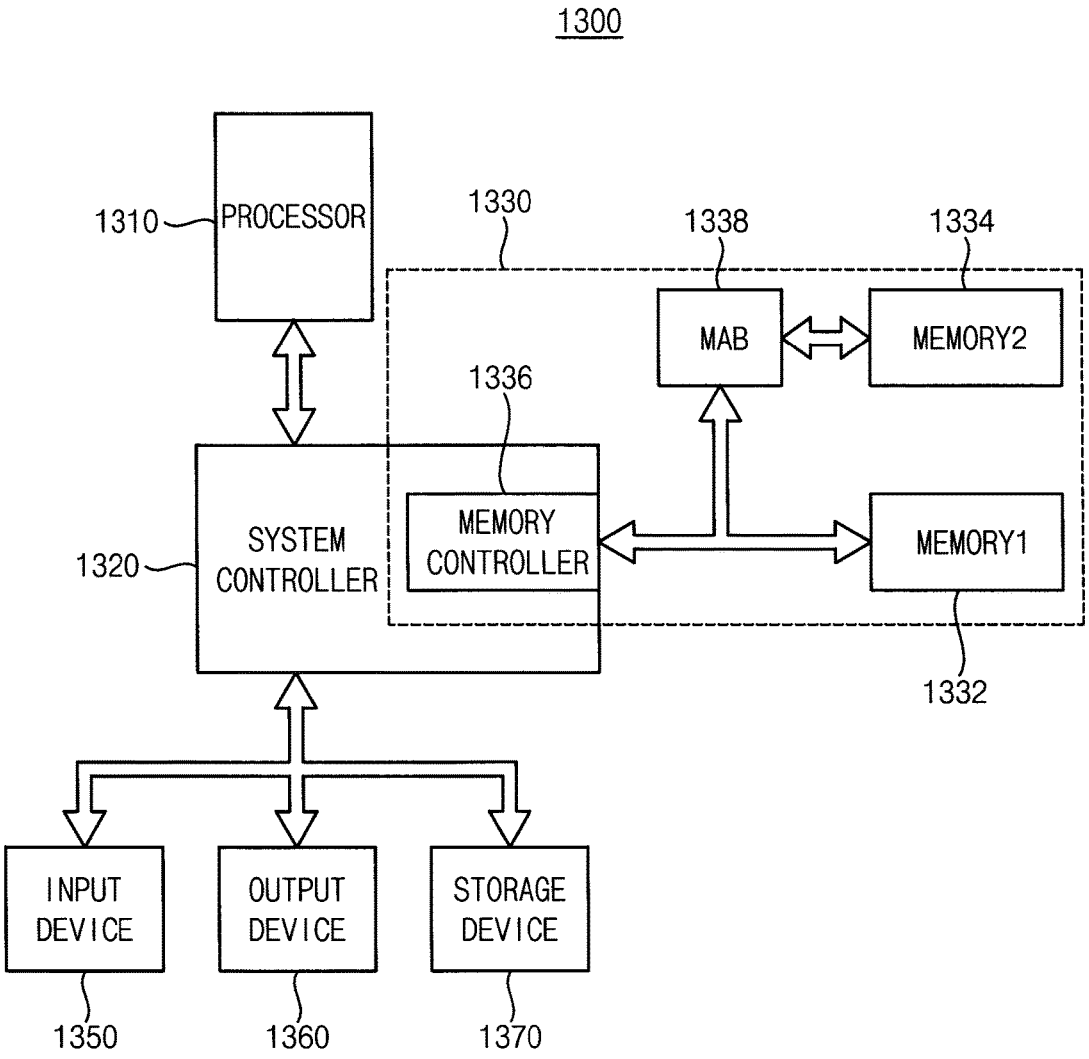
FIG. 18 is a block diagram illustrating a computing system according to example embodiments.

FIG. 18 is a block diagram illustrating a computing system according to example embodiments.

Referring to FIG. 18, an electronic device such as a computing system 1300 may include a processor 1310, a system controller 1320 and a memory system 1330. The computing system 1300 may further include an input device 1350, an output device 1360 and a storage device 1370.

The memory system 1330 may be the memory system 100 of FIG. 1. For example, the memory system 1330 includes a first memory device 1332, a second memory device 1334, a memory controller 1336 and a memory abstraction block 1338. Although not illustrated in FIG. 18, according to example embodiments, the memory abstraction block 1338 may be disposed inside the second memory device 1334. The memory system 1330 may support both the deterministic interface and the nondeterministic interface based on one channel and one memory controller (e.g., the memory controller 1336). For example, the memory controller 1336 may exchange the first data DAT and the first packet PKT with the first memory device 1332 and the second memory device 1334, respectively, through one channel. The first and second memory devices 1332 and 1334 may be different types of memory devices. Accordingly, the memory system 1330 may include various memory devices having various latencies and may have a relatively improved performance.

The processor 1310 may perform various computing functions, such as executing specific software for performing specific calculations or tasks. The processor 1310 may be connected to the system controller 1320 via a processor bus. The system controller 1320 may be connected to the input device 1350, the output device 1360 and the storage device 1370 via an expansion bus. As such, the processor 1310 may control the input device 1350, the output device 1360 and the storage device 1370 using the system controller 1320.

In some example embodiments, the computing system 1300 may further include a power supply, an application chipset, a camera image processor (CIS), etc.

In an embodiment of the present inventive concept, a three-dimensional (3D) memory array may be provided in at least one of the memory devices 110 and 120 of FIGS. 1 and 13, the memory devices 110 and 120a of FIGS. 12 and 14, and the memory devices 1332 and 1334 of FIG. 18. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The above described embodiments may be used in a semiconductor memory device or system or electronic device including the semiconductor memory device, such as a mobile phone, a smart phone, a personal digital assistants (PDA), a portable multimedia player (PMP), a digital camera, a digital television, a set-top box, a music player, a portable game console, a navigation device, a personal computer (PC), a server computer, a workstation, a tablet computer, a laptop computer, a smart card, a printer, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

[1. An electronic device comprising:

a memory controller;

a first memory device coupled to the memory controller;

a second memory device coupled to the memory controller, the second memory device being a different type of memory from the first memory device; and a conversion circuit between the memory controller and the second memory device, wherein the memory controller is configured to:

send a first command and first data to the first memory device according to a first timing scheme to access the first memory device, and send a second command and a packet to the conversion circuit according to the first timing scheme to access the second memory device, and wherein the conversion circuit is configured to:

receive the second command and the packet, and access the second memory device based on the second command and the packet, and wherein:

the packet includes a header code, a tail code, and additional information, and the conversion circuit is configured to strip the header code and the tail code, and to access the second memory device using the additional information.]

[2. The electronic device of claim 1, wherein the conversion circuit is configured to access the second memory device based on the second command and the packet according to a second timing scheme different from the first timing scheme.]

[3. The electronic device of claim 2, wherein the first memory device is configured to communicate directly with the memory controller using a first communication protocol that employs the first timing scheme, and the second memory device is configured to communicate with the memory controller through the conversion circuit using a second communication protocol that employs the second timing scheme.]

[4. The electronic device of claim 2, wherein:

the first timing scheme is a timing scheme used for accessing a volatile memory; and the second timing scheme is a timing scheme used for accessing a non-volatile memory.]

[5. The electronic device of claim 1, wherein the memory controller is further configured to:

transmit a chip select signal that selects one of the first memory device and the second memory device.]

[6. The electronic device of claim 1, wherein at least one of the first memory device and the second memory device includes a three-dimensional memory array in which word-lines and/or bit-lines are shared between levels.]

[7. An electronic device configured to communicate with a memory controller, the electronic device comprising:

a first memory device configured to be coupled directly to the memory controller;

a conversion circuit; and a second memory device configured to be coupled indirectly to the memory controller through the conversion circuit, the second memory device being a different type of memory from the first memory device, wherein the first memory device is configured to communicate directly with the memory controller in response to a first type of access command transmitted from the memory controller, wherein the second memory device is configured to communicate indirectly with the memory controller through the conversion circuit, and wherein the conversion circuit is configured to:

communicate with the memory controller in response to the first type of access command transmitted from the memory controller, receive a packet from the memory controller, wherein the packet includes a header code, a tail code, and additional information, and strip the header code and the tail code, and to access the second memory device using the additional information.]

[8. The electronic device of claim 7, wherein:

the conversion circuit is configured to communicate with the second memory device using a second type of access command different from the first type of access command.]

[9. The electronic device of claim 8, wherein:

the first type of access command is a volatile memory access command, and the second type of access command is a non-volatile memory access command.]

[10. The electronic device of claim 8, wherein:

the conversion circuit is further configured to receive the first type of access command from the memory controller, and based on the access command and other information received from the memory controller in association with the command, transmit the second type of access command to the second memory device.]

[11. A memory system comprising:

a first memory device that uses a first communication protocol for read and write operations;

a second memory device that uses a second communication protocol different from the first communication protocol for read and write operations;

a conversion circuit in communication with the second memory device; and a memory controller configured to generate a first command and a first address in a first operation mode and to access the first memory device using the first command, the first address, and the first communication protocol in the first operation mode, and configured to generate a second command in a second operation mode, to access the second memory device through the conversion circuit, and to communicate with the conversion circuit using the second command and the first communication protocol, wherein the first command and the second command are both commands used for the first communication protocol, wherein the conversion circuit receives the second command and communicates with the second memory device using the second communication protocol, and wherein the conversion circuit is configured to:

receive a packet from the memory controller, wherein the packet includes a header code, a tail code, and additional information, and strip the header code and the tail code, and to access the second memory device using the additional information.]

[12. The memory system of claim 11, wherein the memory controller is configured to:

transmit the first command and the first address to the first memory device through a first channel based on an operation timing of the first communication protocol in the first operation mode, and transmit the second command to the conversion circuit through the first channel based on the operation timing of the first communication protocol in the second operation mode.]

[13. The memory system of claim 12, wherein:

when the first command is a first write command and the first address is a first write address:

the memory controller is configured to access the first memory device by transmitting write data to the first memory device through the first channel in the first operation mode, and the write data is transmitted to the first memory device within a first period after the first write command and the first write address are transmitted to the first memory device through the first channel.]

[14. The memory system of claim 13, wherein when the first command is a first read command and the first address is a first read address:

the memory controller is configured to receive read data from the first memory device through the first channel in the first operation mode, and the read data is received from the first memory device within the first period after the first read command and the first read address are transmitted to the first memory device through the first channel.]

[15. The memory system of claim 13, wherein when the second command is a second write command, the memory controller is configured to transmit a transmission packet to the conversion circuit through the first channel in the second operation mode, and the transmission packet is transmitted to the conversion circuit within the first period after the second write command is transmitted to the conversion circuit through the first channel.]

[16. The memory system of claim 15, wherein when the second command is a second read command, the memory controller is configured to receive a reception packet from the conversion circuit through the first channel in the second operation mode, and the reception packet is received from the conversion circuit within the first period after the second read command is transmitted to the conversion circuit through the first channel.]

[17. The memory system of claim 16, wherein the conversion circuit is configured to generate a read wait signal indicating that the conversion circuit is ready for transmitting the reception packet to the memory controller, and the memory controller is configured to generate the second read command based on the read wait signal.]

[18. The memory system of claim 15, wherein when the transmission packet is a write transmission packet to store write data in the second memory device, the write transmission packet includes a transmission header code, an identification (ID) code, a write command code, a write address code, the write data and a transmission tail code.]

[19. The memory system of claim 15, wherein when the transmission packet is a read transmission packet to retrieve read data from the second memory device, the read transmission packet includes a transmission header code, an ID code, a read command code, a read address code and a transmission tail code.]

*20. A memory system comprising:*

*a memory controller;*

*a first memory device coupled to the memory controller;*

*a conversion circuit coupled to the memory controller; and*

*a second memory device coupled to the conversion circuit, the second memory device being a different type of memory device from the first memory device,*

*wherein the memory controller is configured to send a first command to the first memory device and receive first data according to a first timing scheme to access the first memory device, and send to the conversion circuit a second command and a packet that includes a third command as an encapsulated command, and receive second data from the conversion circuit according to the first timing scheme,*

*wherein the conversion circuit is configured to send the third command to the second memory device and receive third data according to a second timing scheme, the third command is based on the second command,*

*wherein the conversion circuit is further configured to generate and transmit a read wait signal to the memory controller when the second data is ready to be delivered.*

*21. The memory system of claim 20, wherein the read wait signal is activated after the second data is stored in a memory abstraction block of the conversion circuit, and the second data is based on the third data from the second memory device.*

*22. The memory system of claim 21, wherein the memory controller is further configured to transmit the second command in response to the activating of the read wait signal.*

*23. The memory system of claim 22, wherein the first memory device is configured to communicate with the memory controller using a first communication protocol based on the first timing scheme, and the second memory device is configured to communicate with the conversion circuit using a second communication protocol based on the second timing scheme.*

*24. The memory system of claim 23, wherein the second memory device is configured to communicate with the memory controller through the conversion circuit.*

*25. The memory system of claim 24, wherein the conversion circuit is further configured to receive other information from the memory controller in association with the second command.*

*26. The memory system of claim 25, wherein the first timing scheme is used for accessing a volatile memory, and the second timing scheme is used for accessing a non-volatile memory.*

*27. The memory system of claim 26, wherein a first latency of the first timing scheme is smaller than a second latency of the second timing scheme, where the first latency indicates time period between sending the second command and receiving the second data by the memory controller and the second latency indicates time period between sending the third command and receiving the third data by the conversion circuit.*

*28. The memory system of claim 27, wherein the first memory device operates based on a deterministic interface and the second memory device operates based on a nondeterministic interface.*

*29. The memory system of claim 28, wherein the memory controller is further configured to transmit a chip select signal to select one of the first memory device and the second memory device.*

*30. The memory system of claim 29, wherein at least one of the first memory device and the second memory device includes a three-dimensional memory array in which word-lines and/or bit-lines are shared between levels.*

*31. The memory system of claim 20, wherein the memory controller is further configured to send and receive at least one of identification code, error code, and attribute along with the second command and the second data.*

*32. The memory system of claim 31, wherein the at least one of identification code, error code, and attribute are used during accessing the second memory device.*

*33. The memory system of claim 32, wherein the at least one of identification code, error code, and attribute are received by the memory controller within a first latency that is deterministic, where the first latency indicates time period between sending the second command and receiving the at least one of identification code, error code, and attribute by the memory controller.*

*34. An electronic device comprising:*

*a memory controller;*

*a first memory device coupled to the memory controller;*

*a second memory device coupled to the memory controller, the second memory device being a different type of memory from the first memory device; and*

*a conversion circuit between the memory controller and the second memory device,*

*wherein the memory controller is configured to:*

*send a first command and first data to the first memory device according to a first timing scheme to access the first memory device, and*

*send a second command and a packet to the conversion circuit according to the first timing scheme to access the second memory device, and*

*wherein the conversion circuit is configured to:*

*receive the second command and the packet, and access the second memory device based on the second command and the packet, and*

*wherein:*

*the packet includes a header code, a tail code, and additional information, and*

*the conversion circuit is configured to strip the header code and the tail code, and to access the second memory device using the additional information.*

*35. The electronic device of claim 34, wherein the conversion circuit is configured to access the second memory device based on the second command and the packet according to a second timing scheme different from the first timing scheme.*

*36. The electronic device of claim 35, wherein the first memory device is configured to communicate directly with the memory controller using a first communication protocol that employs the first timing scheme, and the second memory device is configured to communicate with the memory controller through the conversion circuit using a second communication protocol that employs the second timing scheme.*

*37. The electronic device of claim 35, wherein the first timing scheme is a timing scheme used for accessing a volatile memory, and the second timing scheme is a timing scheme used for accessing a non-volatile memory.*

*38. The electronic device of claim 34, wherein the memory controller is further configured to transmit a chip select signal that selects one of the first memory device and the second memory device.*

*39. The electronic device of claim 34, wherein at least one of the first memory device and the second memory device includes a three-dimensional memory array in which word-lines and/or bit-lines are shared between levels.*

* * * * *